United States Patent
Takizawa et al.

(10) Patent No.: US 11,322,534 B2
(45) Date of Patent: May 3, 2022

(54) SOLID-STATE IMAGING DEVICE AND ELECTRONIC APPARATUS

(71) Applicant: SONY CORPORATION, Tokyo (JP)

(72) Inventors: Masaaki Takizawa, Kanagawa (JP); Yasushi Tateshita, Kanagawa (JP); Takahiro Toyoshima, Kanagawa (JP); Takuya Toyofuku, Kanagawa (JP); Yorito Sakano, Kanagawa (JP); Motonobu Torii, Fukuoka (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 17/102,238

(22) Filed: Nov. 23, 2020

(65) Prior Publication Data

US 2021/0143193 A1 May 13, 2021

Related U.S. Application Data

(63) Continuation-in-part of application No. 16/069,448, filed as application No. PCT/JP2017/000930 on Jan. 13, 2017, now Pat. No. 10,872,919.

(30) Foreign Application Priority Data

Jan. 29, 2016 (JP) ................................. 2016-016548

(51) Int. Cl.
  *H01L 27/146* (2006.01)
  *H04N 5/355* (2011.01)
  *H04N 5/3745* (2011.01)

(52) U.S. Cl.
  CPC .... *H01L 27/14614* (2013.01); *H01L 27/1463* (2013.01); *H01L 27/1464* (2013.01);
  (Continued)

(58) Field of Classification Search
  CPC .... H04N 5/341; H04N 5/353; H04N 5/35563; H04N 5/3559; H04N 5/359;
  (Continued)

(56) References Cited

U.S. PATENT DOCUMENTS 7,847,847 B2 * 12/2010 Yaung .............. H01L 27/14609
                                                        348/308
9,247,170 B2 * 1/2016 Komori .............. H04N 5/3742
(Continued)

FOREIGN PATENT DOCUMENTS

CN   103247642 A    8/2013
CN   103855174 A    6/2014
(Continued)

OTHER PUBLICATIONS

International Search Report and Written Opinion of PCT Application No. PCT/JP2017/000930, dated Apr. 4, 2017, 12 pages of English Translation and 11 pages of ISRWO.
(Continued)

*Primary Examiner* — Lin Ye
*Assistant Examiner* — Chriss S Yoder, III
(74) *Attorney, Agent, or Firm* — Chip Law Group

(57) ABSTRACT

The present disclosure relates to a solid-state imaging device and an electronic apparatus which allow reduction of optical crosstalk. In an example of FIG. 5B, a charge storage unit is formed by a method in which a hole is bored in a substrate,
(Continued)

a diffusion layer is formed in a surface of the hole, and an insulating film and an upper electrode are formed so as to fill the hole. In an example of FIG. 5C, a charge storage unit is formed by a method in which a hole is bored in a substrate, a diffusion layer is formed in a half (one side) of a surface of the hole, and an insulating film and an upper electrode are formed so as to fill the hole. The present disclosure can be applied to a CMOS solid-state imaging device used for an imaging apparatus such as a camera, for example.

9 Claims, 46 Drawing Sheets

(52) U.S. Cl.
CPC .. *H01L 27/14603* (2013.01); *H01L 27/14605* (2013.01); *H01L 27/14643* (2013.01); *H01L 27/14645* (2013.01); *H01L 27/14683* (2013.01); *H04N 5/3559* (2013.01); *H04N 5/35563* (2013.01); *H04N 5/37452* (2013.01); H01L 27/14621 (2013.01); H01L 27/14627 (2013.01)

(58) Field of Classification Search
CPC .. H04N 5/3696; H04N 5/37452; H04N 5/378; H01L 27/14603; H01L 27/14605; H01L 27/14607; H01L 27/1461; H01L 27/14614; H01L 27/14621; H01L 27/14627; H01L 27/1463; H01L 27/1464; H01L 27/14643; H01L 27/14645; H01L 27/14683; H01L 27/14689
See application file for complete search history.

(56) References Cited

U.S. PATENT DOCUMENTS

| 2006/0208161 | A1 | 9/2006 | Okita et al. |
| 2011/0049589 | A1* | 3/2011 | Chuang ............. H01L 27/14643 257/292 |
| 2013/0200479 | A1 | 8/2013 | Sakano et al. |
| 2014/0151531 | A1 | 6/2014 | Yamashita |
| 2015/0228684 | A1 | 8/2015 | Yamashita |
| 2017/0118424 | A1* | 4/2017 | Lule ................... H04N 9/04557 |

FOREIGN PATENT DOCUMENTS

| CN | 104835826 A | 8/2015 |
| JP | 2006-262388 A | 9/2006 |
| JP | 2013-161945 A | 8/2013 |
| JP | 2014-112580 A | 6/2014 |
| JP | 2015-153772 A | 8/2015 |
| KR | 10-2015-0094489 A | 8/2015 |
| TW | 201532257 A | 8/2015 |

OTHER PUBLICATIONS

International Preliminary Report on Patentability of PCT Application No. PCT/JP2017/000930, dated Aug. 9, 2018, 10 pages of English Translation and 06 pages of IPRP.

Non-Final Office Action for U.S. Appl. No. 16/069,448, dated May 15, 2020, 14 pages.

Notice of Allowance for U.S. Appl. No. 16/069,448, dated Aug. 20, 2020, 08 pages.

* cited by examiner

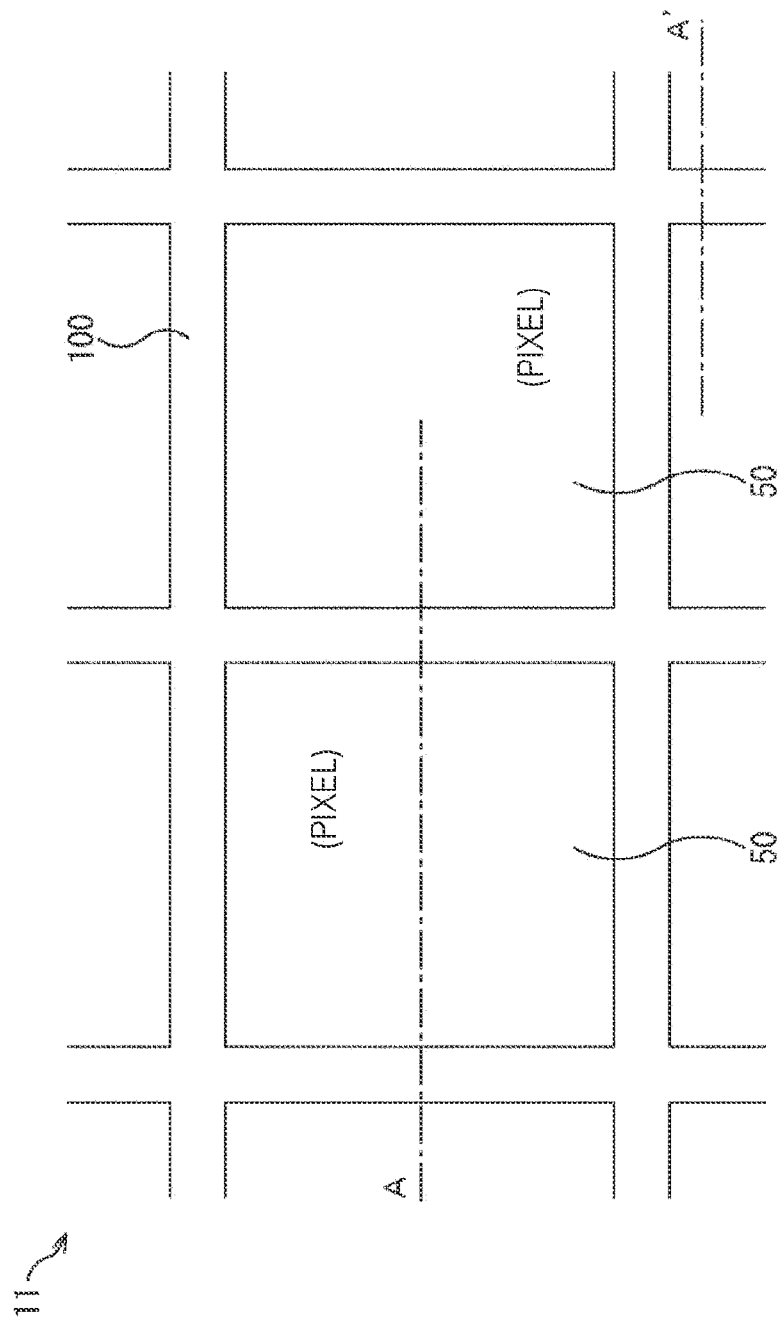

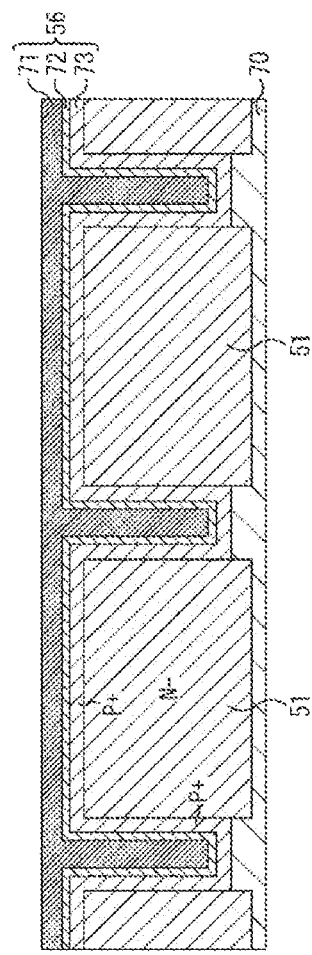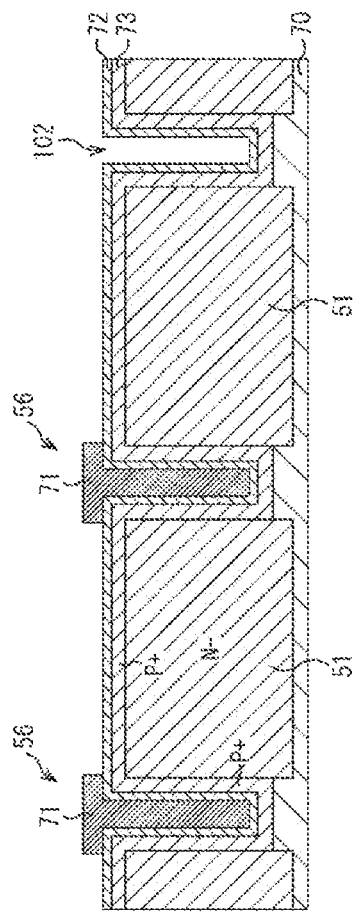

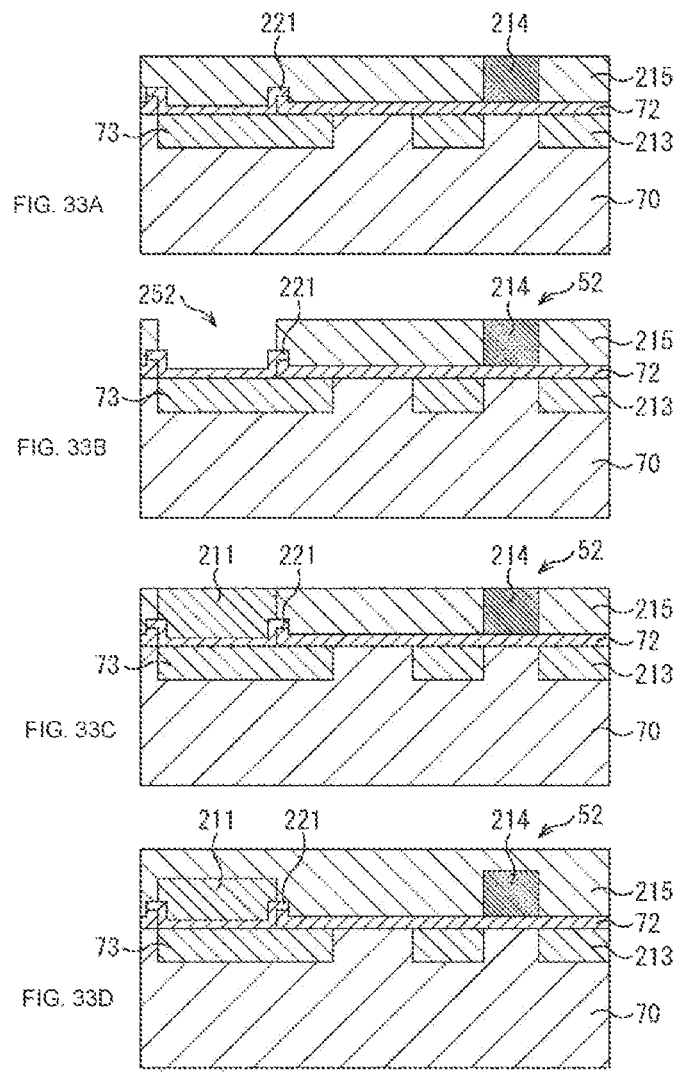

SOLID-STATE IMAGING DEVICE AND ELECTRONIC APPARATUS

CROSS REFERENCE TO RELATED APPLICATIONS

This application is continuation application of U.S. patent application Ser. No. 16/069,448, filed on Jul. 11, 2018, which is a U.S. National Phase of International Patent Application No. PCT/JP2017/000930 filed on Jan. 13, 2017, which claims priority benefit of Japanese Patent Application No. JP 2016-016548 filed in the Japan Patent Office on Jan. 29, 2016. Each of the above-referenced applications is hereby incorporated herein by reference in its entirety.

TECHNICAL FIELD

The present disclosure relates to a solid-state imaging device and an electronic apparatus, and particularly to a solid-state imaging device and an electronic apparatus which allow reduction of optical crosstalk.

BACKGROUND ART

There is provided a contact image sensor (CIS: CMOS image sensor) which includes a capacitor and increases a dynamic range (refer to Patent Document 1). A CIS is obtained by a method employing a photoelectric conversion element using a "complementary metal-oxide semiconductor", and the element is referred to as a complementary MOS (CMOS) sensor.

CITATION LIST

Patent Document

Patent Document 1: JP 4317115 B2

SUMMARY OF THE INVENTION

Problems to be Solved by the Invention

For the above-described CIS, it is demanded that a dynamic range should be increased with a smaller pixel size.

The present disclosure has been made in view of the above-described situation, and allows reduction of optical crosstalk which occurs due to reduction of a pixel size.

Solutions to Problems

A solid-state imaging device of a first aspect of the present technology includes: a pixel array unit in which a plurality of unit pixels are arranged; and a drive unit configured to control an operation of the unit pixels, in which each of the unit pixels includes: a photoelectric conversion unit; and a trench-type charge storage unit configured to store charge generated by the photoelectric conversion unit.

The charge storage unit is placed between the photoelectric conversion unit and another photoelectric conversion unit included in an adjacent one of the unit pixels.

Each of the unit pixels includes a plurality of the photoelectric conversion units, and the charge storage unit is placed between the plurality of photoelectric conversion units, or between the photoelectric conversion unit and another photoelectric conversion unit included in an adjacent one of the unit pixels.

Each of the unit pixels can further include a reverse-side DTI (RDTI) placed adjacently to the charge storage unit.

The RDTI is formed so as to be joined to the charge storage unit.

The charge storage unit is formed so as to penetrate a substrate.

A potential of one end of the charge storage unit is a ground potential, a power-supply potential, or a third potential.

The potential of the one end of the charge storage unit is set at different potentials at a storing time and a reading time of the photoelectric conversion unit.

The solid-state imaging device is of a backside-illuminated type.

An electronic apparatus of a first aspect of the present technology includes: a solid-state imaging device including: a pixel array unit in which a plurality of unit pixels are arranged; and a drive unit configured to control an operation of the unit pixels, each of the unit pixels including: a photoelectric conversion unit; and a trench-type charge storage unit configured to store charge generated by the photoelectric conversion unit; a signal processing circuit configured to process an output signal output from the solid-state imaging device; and an optical system configured to provide incident light to the solid-state imaging device.

A solid-state imaging device of a second aspect of the present technology includes: a pixel array unit in which a plurality of unit pixels are arranged; and a drive unit configured to control an operation of the unit pixels, in which each of the unit pixels includes: a first photoelectric conversion unit; a second photoelectric conversion unit having a sensitivity lower than that of the first photoelectric conversion unit; a charge storage unit configured to store charge generated by the second photoelectric conversion unit, the charge storage unit including a gate electrode of metal and a High-k insulating film; and a transistor configured to transfer charge generated by the first or second photoelectric conversion unit.

The charge storage unit is placed simultaneously with the transistor.

The metal is a metal having a high melting point of Ti, TiN, or W, or a compound of the metal.

The High-k insulating film is Hf02, Al203, or Ta205.

The solid-state imaging device is of a backside-illuminated type.

An electronic apparatus of a second aspect of the present technology includes: a solid-state imaging device including: a pixel array unit in which a plurality of unit pixels are arranged; and a drive unit configured to control an operation of the unit pixels, each of the unit pixels including: a first photoelectric conversion unit; a second photoelectric conversion unit having a sensitivity lower than that of the first photoelectric conversion unit; a charge storage unit configured to store charge generated by the second photoelectric conversion unit, the charge storage unit including a gate electrode of metal and a High-k insulating film; and a transistor configured to transfer charge generated by the first or second photoelectric conversion unit, the electronic apparatus further including: a signal processing circuit configured to process an output signal output from the solid-state imaging device; and an optical system configured to provide incident light to the solid-state imaging device.

A solid-state imaging device of a third aspect of the present technology includes: a pixel array unit in which a plurality of unit pixels are arranged; a drive unit configured to control an operation of the unit pixels; and a trench-shaped element isolation.

The element isolation is formed so as to surround a specific one of the unit pixels.

Each of the unit pixels includes: a first photoelectric conversion unit; and a second photoelectric conversion unit having a sensitivity lower than that of the first photoelectric conversion unit, and the element isolation is formed so as to surround the second photoelectric conversion unit.

The element isolation includes Hf02, Al203, or Ta205.

An electronic apparatus of a third aspect of the present technology includes: a solid-state imaging device including: a pixel array unit in which a plurality of unit pixels are arranged; a drive unit configured to control an operation of the unit pixels; and a trench-shaped element isolation; a signal processing circuit configured to process an output signal output from the solid-state imaging device; and an optical system configured to provide incident light to the solid-state imaging device.

In the first aspect of the present technology, the pixel array unit in which the plurality of unit pixels are arranged, and the drive unit configured to control an operation of the unit pixels, are provided. Then, each of the unit pixels includes the photoelectric conversion unit, and the trench-type charge storage unit configured to store charge generated by the photoelectric conversion unit.

In the second aspect of the present technology, the pixel array unit in which the plurality of unit pixels are arranged, and the drive unit configured to control an operation of the unit pixels, are provided. Then, each of the unit pixels includes: the first photoelectric conversion unit; the second photoelectric conversion unit having a sensitivity lower than that of the first photoelectric conversion unit; and the charge storage unit configured to store charge generated by the second photoelectric conversion unit, the charge storage unit including a gate electrode of metal and a High-k insulating film; and a transistor configured to transfer charge generated by the first or second photoelectric conversion unit.

In the third aspect of the present technology, the pixel array unit in which the plurality of unit pixels are arranged, the drive unit configured to control an operation of the unit pixels, and a trench-shaped element isolation are provided.

Effects of the Invention

According to the present technology, optical crosstalk can be reduced. Particularly, optical crosstalk occurring due to reduction of a pixel size can be reduced.

It is noted that the effects described in the present specification are mere examples, and effects of the present technology are not limited to the effects described in the present specification and can include additional effects.

BRIEF DESCRIPTION OF DRAWINGS

FIG. 15 is a plan view showing a configuration example of a pixel array unit.

FIGS. 17A and 17B are process charts showing an example of a forming process.

FIGS. 33A, 33B, 33C, and 33D are process charts showing an example of a forming process.

MODE FOR CARRYING OUT THE INVENTION

Below, modes for carrying out the present disclosure (which will be referred to as embodiments) will be described. It is noted that description will be made in the following order.
1. A solid-state imaging device to which the present technology is applied.
2. A first embodiment (a trench capacitor of a circuit with one photodiode).
3. A second embodiment (a trench capacitor of a circuit with two photodiodes).
4. A third embodiment (a metal-gate-electrode capacitor).
5. A fourth embodiment (a trench-shaped element isolation of a circuit with two photodiodes).
6. A fifth embodiment (a trench-shaped element isolation: modifications).
7. Examples of use of an image sensor.
8. An example of an electronic apparatus.

1. Solid-State Imaging Device to Which the Present Technology is Applied

{Basic System Configuration}

Figure 1:
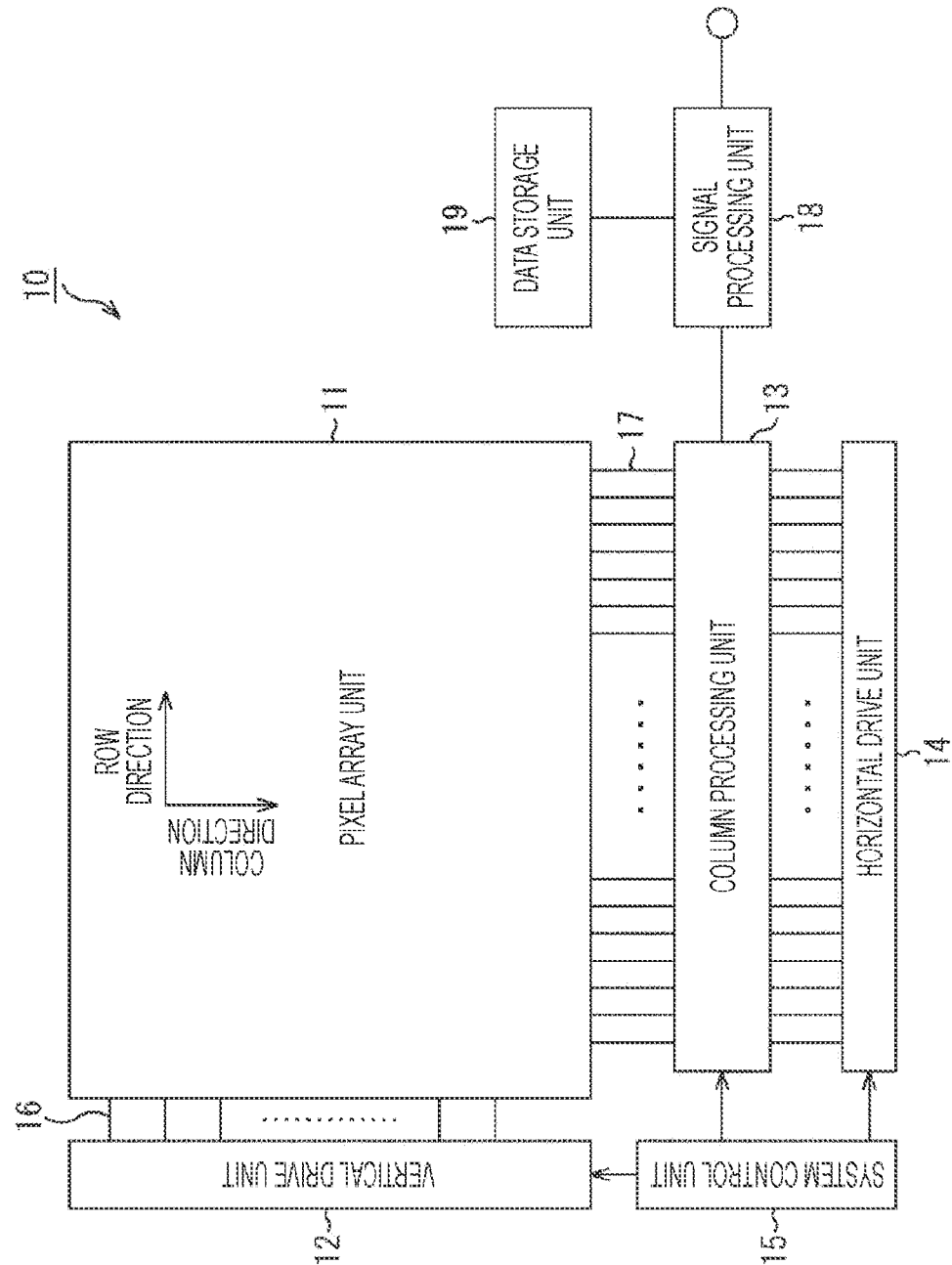
FIG. 1 is a system configuration diagram showing an outline of a configuration of a CMOS image sensor to which the present technology is applied.

FIG. 1 is a system configuration diagram showing an outline of a configuration of a solid-state imaging device to which the present technology is applied, such as a CMOS image sensor which is one kind of an X-Y addressing solid-state imaging device. In this regard, a CMOS image sensor is an image sensor which is manufactured by applying, or partially utilizing, a CMOS process. For example, a solid-state imaging device includes a backside-illuminated CMOS image sensor.

A CMOS image sensor 10 according to the present application case includes a pixel array unit 11 formed on a semiconductor substrate (chip) not shown, and a peripheral circuit unit integrated on the same semiconductor substrate as the pixel array unit 11. The peripheral circuit unit includes a vertical drive unit 12, a column processing unit 13, a horizontal drive unit 14, and a system control unit 15, for example.

The CMOS image sensor 10 further includes a signal processing unit 18 and a data storage unit 19. The signal processing unit 18 and the data storage unit 19 may be mounted on the same substrate as the CMOS image sensor 10, or alternatively be placed on a substrate distinct from the substrate that carries the CMOS image sensor 10. Also, each processing performed by the signal processing unit 18 and the data storage unit 19 may be performed by an external-signal processing unit provided on a substrate distinct from the substrate that carries the CMOS image sensor 10, such as a digital signal processor (DSP) circuit or software.

The pixel array unit 11 includes two-dimensional arrangement of unit pixels in which the unit pixels each including a photoelectric conversion unit which generates and stores charge in accordance with an amount of received light (which will hereinafter be simply referred to as a "pixel" in some portions), are arranged in a row direction and a column direction, in other words, in a matrix. In this regard, a row direction means a direction in which pixels in a pixel row are arranged (that is, a horizontal direction), and a column direction means a direction in which pixels in a pixel column are arranged (that is, a vertical direction). A specific circuit configuration and details of a pixel structure of a unit pixel will be described later.

In the pixel array unit 11, for pixel arrangement in a matrix, a pixel drive line 16 is installed along a row direction so as to correspond to each pixel row, and a vertical signal line 17 is installed along a column direction so as to correspond to each pixel column. The pixel drive line 16 transmits a drive signal for a drive at a time of reading out a signal from a pixel. Although FIG. 1 shows one line as the pixel drive line 16, the pixel drive line 16 is not limited to one line. One end of the pixel drive line 16 is connected to an output end corresponding to each row of the vertical drive unit 12.

The vertical drive unit 12 includes a shift register, an address decoder, or the like, and drives all pixels in the pixel array unit 11 at the same time, or on a-row-by-row basis, or the like. In other words, the vertical drive unit 12, together with the system control unit 15 which controls the vertical drive unit 12, forms a drive unit which controls an operation of each pixel in the pixel array unit 11. Although a specific configuration of the vertical drive unit 12 is not shown, the vertical drive unit 12 is configured so as to have two scan systems of a reading scan system and a sweeping scan system generally.

The reading scan system selectively scans unit pixels in the pixel array unit 11 sequentially on a row-by-row basis, in order to read out a signal from a unit pixel. A signal read out from a unit pixel is an analog signal. The sweeping scan system performs a sweeping scan on a read row which is to be subjected to a reading scan by the reading scan system, earlier than the reading scan by an exposure time.

As a result of the sweeping scan being performed by the sweeping scan system, unnecessary charge is swept from a photoelectric conversion unit of a unit pixel in a read row, so that the photoelectric conversion unit is reset. Then, by the operation of sweeping unnecessary charge (resetting operation) which is performed by the sweeping scan system, a so-called electronic shutter operation is accomplished. In this regard, an electronic shutter operation means an operation of releasing charge in a photoelectric conversion unit and newly starting exposure (starting storage of charge).

A signal read out as a result of a reading operation by the reading scan system corresponds to an amount of light received after an immediately preceding reading operation or electronic shutter operation. Then, a period from a reading time at which an immediately preceding reading operation is performed, or a sweeping time at which an immediately preceding electronic shutter operation is performed, to a reading time at which a current reading operation is performed, is a charge exposure period in a unit pixel.

A signal output from each unit pixel in a pixel row which is selectively scanned by the vertical drive unit 12 is input to the column processing unit 13 via each of the vertical signal lines 17 for each pixel column. The column processing unit 13 performs predetermined signal processing on a signal which is output from each pixel in a selected row via the vertical signal line 17 and temporarily holds a pixel signal on which signal processing is performed, for each pixel column of the pixel array unit 11.

More specifically, the column processing unit 13 performs at least a noise removing process such as a correlated double sampling (CDS) process or a double data sampling (DDS) process, for example, as signal processing. For example, a CDS process removes a reset noise or a fixed pattern noise unique to a pixel, such as variation in a threshold value of an amplification transistor in a pixel. Other than a noise removing process, it is also possible to provide the column processing unit 13 with an analog-to-digital (AD) conversion function, for example, so that an analog pixel signal can be converted to a digital signal, and be output.

The horizontal drive unit 14 includes a shift register, an address decoder, or the like, and sequentially selects a unit circuit corresponding to a pixel column of the column processing unit 13. As a result of a selective scan being performed by the horizontal drive unit 14, pixel signals on which signal processing is performed for each unit circuit in the column processing unit 13 are sequentially output.

The system control unit 15 includes a timing generator which generates various timing signals and the like, and controls a drive of each of the vertical drive unit 12, the column processing unit 13, the horizontal drive unit 14, and the like, on the basis of various timings generated by the timing generator.

The signal processing unit 18 has at least an arithmetic processing function, and performs various kinds of signal processing such as arithmetic processing on a pixel signal output from the column processing unit 13. For signal processing in the signal processing unit 18, the data storage unit 19 temporarily holds data required for the signal processing.

{Other System Configurations}

The CMOS image sensor 10 to which the present technology is applied is not limited to the above-described system configuration. As the other system configurations, the following system configurations can be cited.

Figure 2:
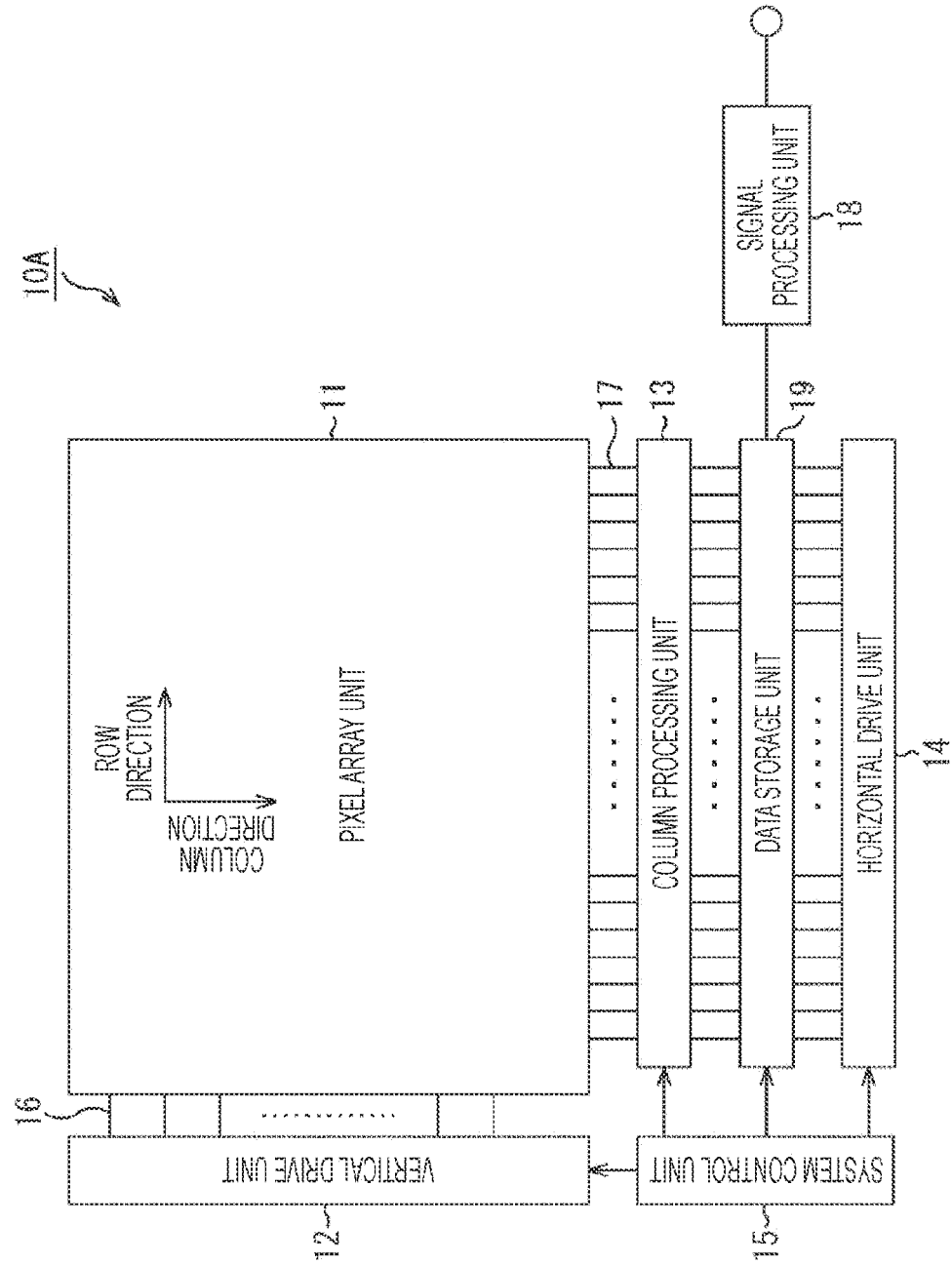
FIG. 2 is a system configuration diagram (No. 1) showing another system configuration of the CMOS image sensor to which the present technology is applied.

For example, as shown in FIG. 2, cited is a CMOS image sensor 10A having a system configuration in which the data storage unit 19 is placed at a stage subsequent to the column processing unit 13 and a pixel signal output from the column processing unit 13 is fed to the signal processing unit 18 via the data storage unit 19.

Figure 3:
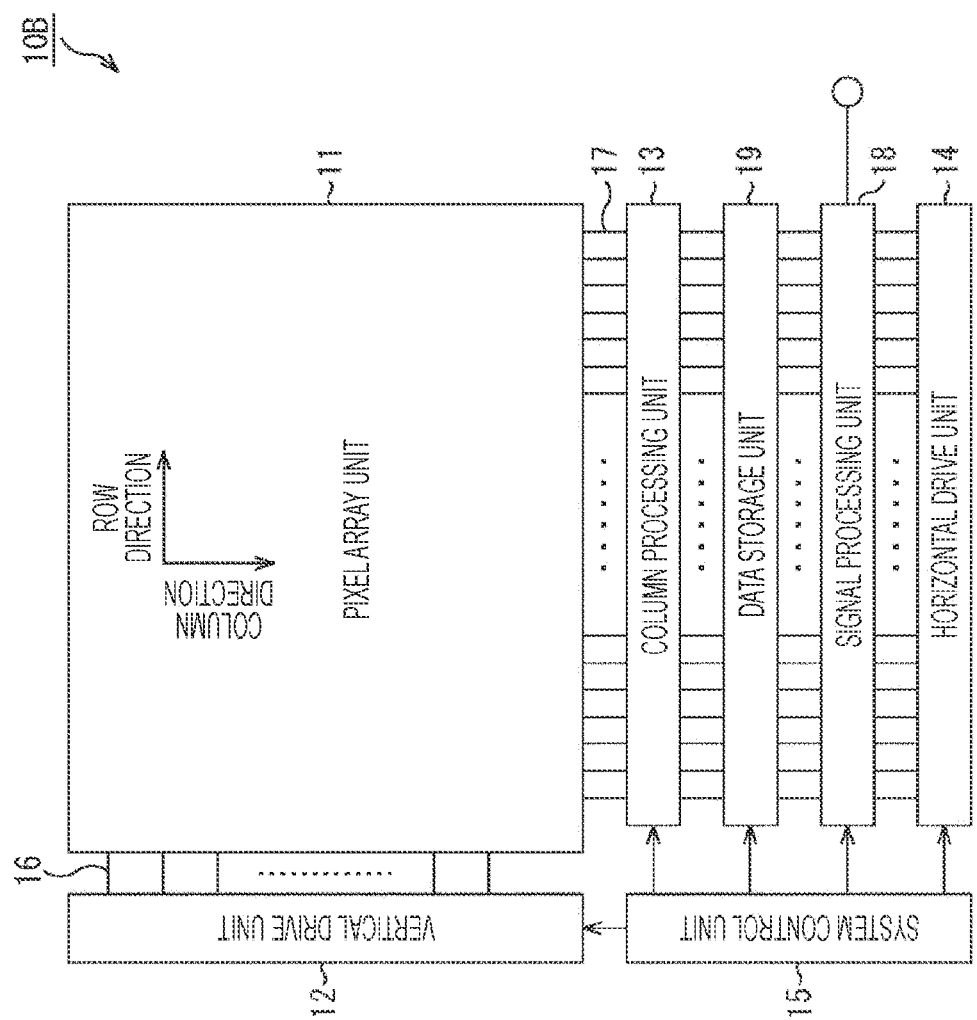
FIG. 3 is a system configuration diagram (No. 2) showing another different system configuration of the CMOS image sensor to which the present technology is applied.

Further, as shown in FIG. 3, cited is a CMOS image sensor 10B having a system configuration in which the column processing unit 13 is provided with an AD conversion function of performing AD conversion for each row, or each plurality of rows, of the pixel array unit 11, and the data storage unit 19 and the signal processing unit 18 are provided in parallel with the column processing unit 13.

2. First Embodiment (Circuit Configuration with One Photodiode

Next, a first embodiment of the present technology will be described.

{Circuit Configuration of Unit Pixel 50}

Figure 4:
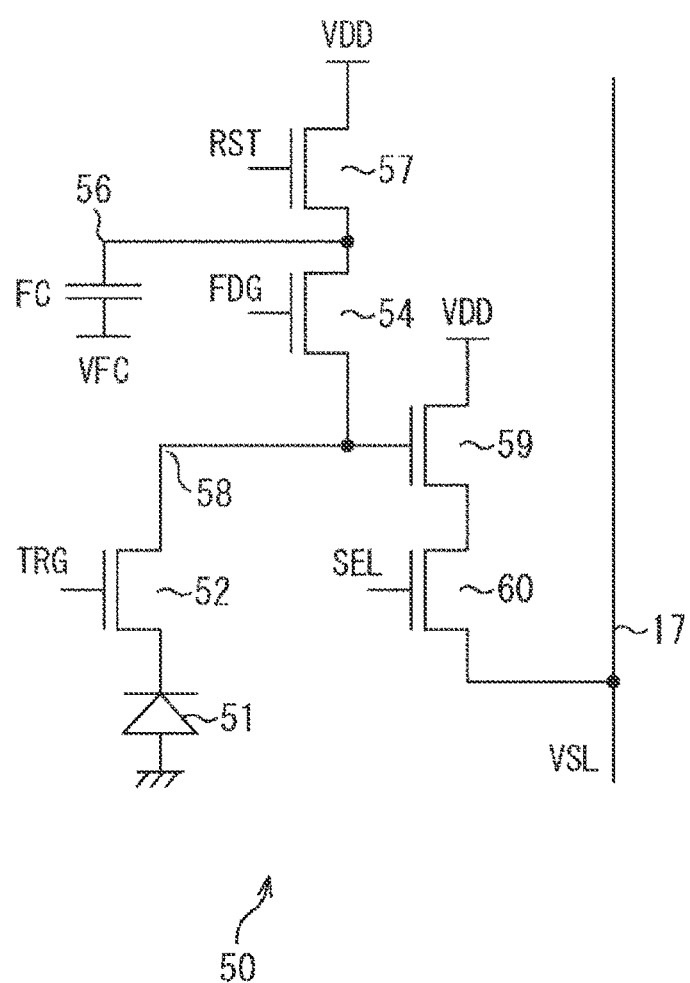
FIG. 4 is a circuit diagram showing a configuration example of a unit pixel according to a first embodiment of the present technology.

FIG. 4 is a circuit diagram showing a configuration example of a unit pixel 50 placed in a pixel array unit 11 shown in FIGS. 1 to 3.

The unit pixel 50 is configured so as to include a first photoelectric conversion unit 51, a first transfer gate unit 52, a second transfer gate unit 54, a charge storage unit 56, a reset gate unit 57, a floating diffusion (FD) unit 58, an amplification transistor 59, and a selection transistor 60.

Also, for the unit pixels 50, a plurality of drive lines are installed as pixel drive lines 16 shown in FIGS. 1 to 3 so as to correspond to pixel rows, respectively, for example. Then, various kinds of drive signals TRG, FDG, RST, and SEL are fed from a vertical drive unit 12 shown in FIGS. 1 to 3 via the plurality of drive lines. Those drive signals are pulse signals which become active while being at a high level (a power supply voltage VDD, for example), and become inactive while being at a low level (a negative potential, for example), because each transistor of the unit pixel 50 is an NMOS transistor.

The first photoelectric conversion unit 51 includes a photodiode (PD) of a PN junction, for example. The first photoelectric conversion unit 51 generates and stores charge in accordance with an amount of received light.

The first transfer gate unit 52 is connected between the first photoelectric conversion unit 51 and the FD unit 58. The drive signal TRG is applied to a gate electrode of the first transfer gate unit 52. When the drive signal TRG becomes active, the first transfer gate unit 52 is placed in a conducting state, so that charge stored in the first photoelectric conversion unit 51 is transferred to the FD unit 58 via the first transfer gate unit 52.

The second transfer gate unit 54 is connected between the charge storage unit 56 and the FD unit 58. The drive signal FDG is applied to a gate electrode of the second transfer gate unit 54. When the drive signal FDG becomes active, the second transfer gate unit 54 is placed in a conducting state, so that potentials of the charge storage unit 56 and the FD unit 58 are joined.

The charge storage unit 56 includes a capacitor, for example, and is connected to the FD unit 58 with the second transfer gate unit 54 being interposed. A counter electrode of the charge storage unit 56 is connected to VFC. It is noted that the counter electrode of the charge storage unit 56 may be GND. The charge storage unit 56 stores charge which is transferred from the first photoelectric conversion unit 51.

The reset gate unit 57 is connected between a power supply VDD and the FD unit 58. The drive signal RST is applied to a gate electrode of the reset gate unit 57. When the drive signal RST becomes active, the reset gate unit 57 is placed in a conducting state, so that a potential of the FD unit 58 is reset to a level of the power supply voltage VDD.

The FD unit 58 performs charge-to-voltage conversion, to convert charge to a voltage signal and output a resultant signal.

The amplification transistor 59 which has a gate electrode connected to the FD unit 58 and has a drain electrode connected to the power supply VDD, serves as an input unit of a reading circuit which reads out charge held in the FD unit 58, in other words, a so-called source follower circuit. That is, a source electrode of the amplification transistor 59 is connected to a vertical signal line 17 with the selection transistor 60 being interposed, so that the amplification transistor 59, together with a constant-current supply connected to one end of the vertical signal line 17, forms a source follower circuit.

The selection transistor 60 is connected between a source electrode of the amplification transistor 59 and the vertical signal line 17. The drive signal SEL is applied to a gate electrode of the selection transistor 60. When the drive signal SEL becomes active, the selection transistor 60 is placed in a conducting state, so that the unit pixel 50 is placed in a selected state. As a result of this, a pixel signal output from the amplification transistor 59 is output to the vertical signal line 17 via the selection transistor 60.

It is noted that hereinafter, becoming active of each drive signal will be also referred to as being turned-on of each drive signal, and becoming inactive of each drive signal will be also referred to as being turned-off of each drive signal. Also, hereinafter, being placed in a conducting state of each gate unit or each transistor will be also referred to as being turned-on of each gate unit or each transistor, and being placed in a nonconducting state of each gate unit or each transistor will be also referred to as being turned-off of each gate unit or each transistor.

{Cross-Sectional View of Charge Storage Unit}

Figure 5:
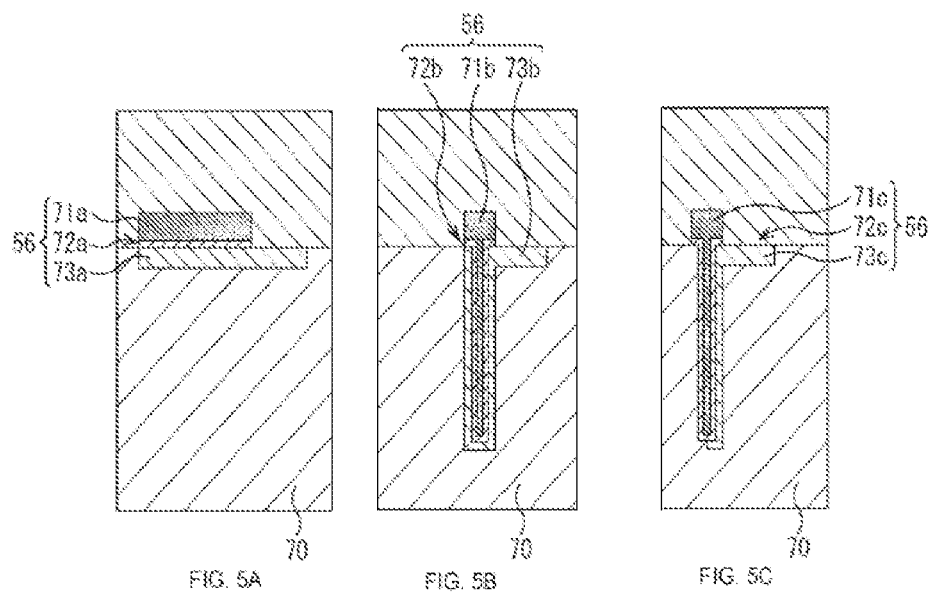
FIGS. 5A, 5B, and 5C are cross-sectional views showing a configuration example of a charge storage unit in FIG. 4.

FIGS. 5A, 5B, and 5C are cross-sectional views showing an example of a capacitance element which is the charge storage unit 56 in FIG. 4. FIG. 5A shows a capacitor, and FIGS. 5A and 5B show examples of a trench capacitor according to the present technology.

In an example of FIG. 5A, the charge storage unit 56 includes an upper electrode 71a, an insulating film 72a, and a diffusion layer 73a. In an example of FIG. 5B, the charge storage unit 56 includes an upper electrode 71b, an insulating film 72b, and a diffusion layer 73b. In an example of FIG. 5C, the charge storage unit 56 includes an upper electrode 71c, an insulating film 72c, and a diffusion layer 73c.

The upper electrodes 71a to 71c formed in a substrate 70 include poly-Si, for example. The insulating films 72a to 72c are insulating-film capacitors. The diffusion layers 73a to 73c are Si-side electrodes.

In the example of FIG. 5A, the charge storage unit 56 is formed on a surface of a substrate. In contrast thereto, in the example of FIG. 5B, the charge storage unit 56 is formed by a method in which a hole is bored in a substrate 70, the diffusion layer 73b is formed in a surface of the hole, and the insulating film 72b and the upper electrode 71b are formed so as to fill the hole. In the example of FIG. 5C, the charge storage unit 56 is formed by a method in which a hole is bored in the substrate 70, the diffusion layer 73c is formed in a half (one side) of a surface of the hole, and the insulating film 72c and the upper electrode 71c are formed so as to fill the hole. Hereinafter, the upper electrodes 71b and 71c, the insulating films 72b and 72c, and the diffusion layers 73b and 73c will be collectively referred to as the upper electrode 71, the insulating film 72, and the diffusion layer 73, respectively.

In the examples of FIGS. 5B and 5C, one end of the charge storage unit 56 is connected to the diffusion layer 73 which stores charge generated by photoelectric conversion, and the other end is connected to VFC.

A VFC can be connected to the upper electrode 71 which is to serve as a terminal of a capacitor and the diffusion layer 73 in the following three ways 1. to 3.
1. To connect a VFC to the upper electrode 71.
2. To connect a VFC to the N-type diffusion layer 73.
3. To connect a VFC to the P-type diffusion layer 73.

With regard to the above, a voltage being applied is arbitrary in the case 1., is equal to or higher than GND in the case 2., and is equal to GND in the case 3. However, it is preferable that a node is connected to an upper electrode.

It is noted that a voltage of a VFC can be set at different potentials at a storing time and a reading time of the first photoelectric conversion unit 51, respectively, in addition to a ground potential, a power-supply potential, and a third potential. As an electrode of the charge storage unit 56 which stores charge generated by photoelectric conversion, either an electrode formed on the insulating film 72 or a diffusion layer formed in a substrate is selected. In this regard, if there is a region where a failure in light shielding occurs, a noise is generated. In order to suppress such a situation, no diffusion layer is formed in the foregoing region.

The charge storage unit 56 (capacitance element) formed in a substrate in the above-described manner is placed between PDs which are the first photoelectric conversion units 51. As a result of this, in the unit pixels 50, a capacitance element can function as a shield pair against crosstalk between PDs. This increases a dynamic range.

Specifically, crosstalk takes place by two causes of leaking light and diffusion of charge. Regarding leaking light, incident light is confined in one PD by reflection from an interface which is caused due to a difference in refractive index between the insulating film 72 of the charge storage unit 56 which is a capacitance element, and Si, and this effect of confining light can reduce crosstalk. Also, regarding diffusion of charge, the insulating film 72 of a capacitance element has an effect of blocking a path for diffusion of charge, so that crosstalk is reduced.

It is noted that the insulating film 72 of a capacitor is formed in the same process as a gate oxide film of a transistor in the unit pixel 50, and alternatively is formed in a different process or a composite process thereof. By making the insulating film 72 thicker than a gate oxide film of a transistor, it is possible to enhance reflectivity of an interface and improve a shielding effect.

{Plan View of Unit Pixel 50}

Figure 6:
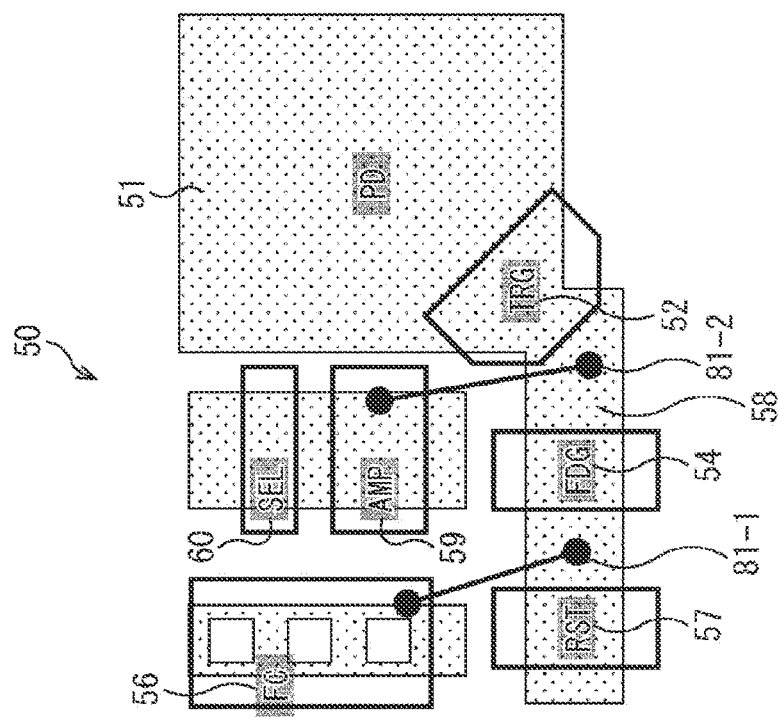
FIG. 6 is a plan view showing a configuration example of the unit pixel in FIG. 4.

FIG. 6 is a plan view showing a configuration example of the unit pixel in FIG. 4. FIG. 6 shows an example in which a trench capacitor is employed for a sectional structure of a capacitance element which is the charge storage unit 56. In a plan view of FIG. 6, a wire 81-1 connecting the charge storage unit 56 and the FD unit 58 and a wire 81-2 connecting the FD unit 58 and a gate electrode of the amplification transistor 59 are shown also.

In the case of FIG. 6, the charge storage unit 56 is formed by a method in which a hole is bored in the substrate 70 and an insulating film and an upper electrode are formed. The charge storage unit 56 is placed between the first photoelectric conversion units 51 of the respective unit pixels 50. By placing the charge storage unit 56 in each of plural positions (three positions in the example of FIG. 6), not in a single position, a capacitance value and a shielding effect can be increased.

Figure 7:
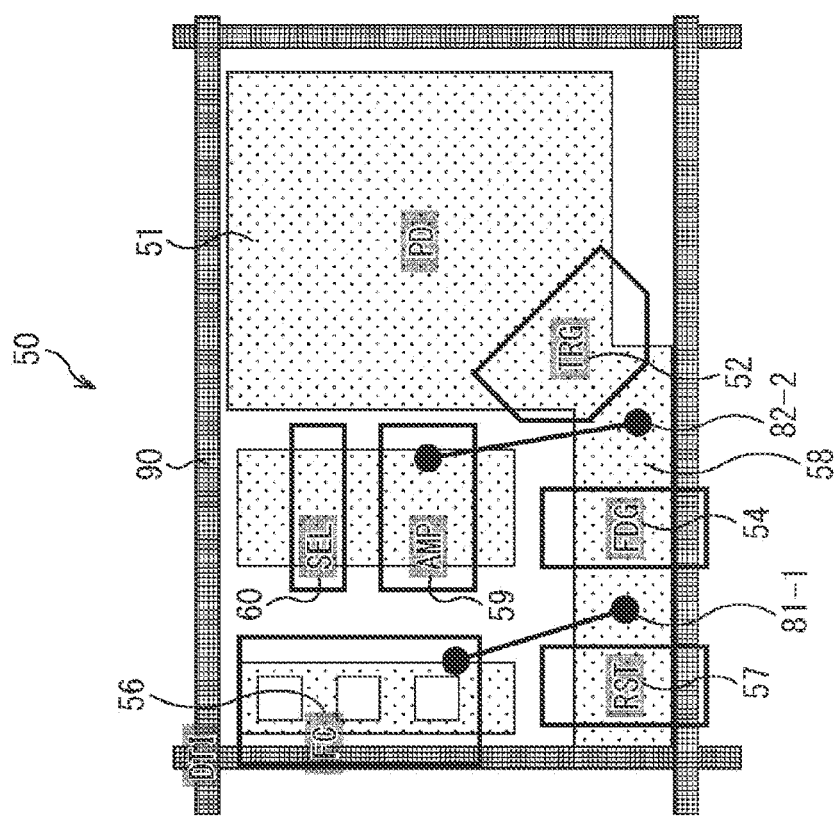
FIG. 7 is a plan view showing an example in which a DTI is additionally placed in the unit pixel in FIG. 6.

FIG. 7 is a plan view showing an example in which a deep trench isolation (DTI) is additionally placed in the unit pixel in FIG. 6. In the example of FIG. 7, a DTI 90 having a shielding effect is placed around the unit pixel 50. As a result of this, the first photoelectric conversion units 51 are shielded from each other more securely.

Figure 8:
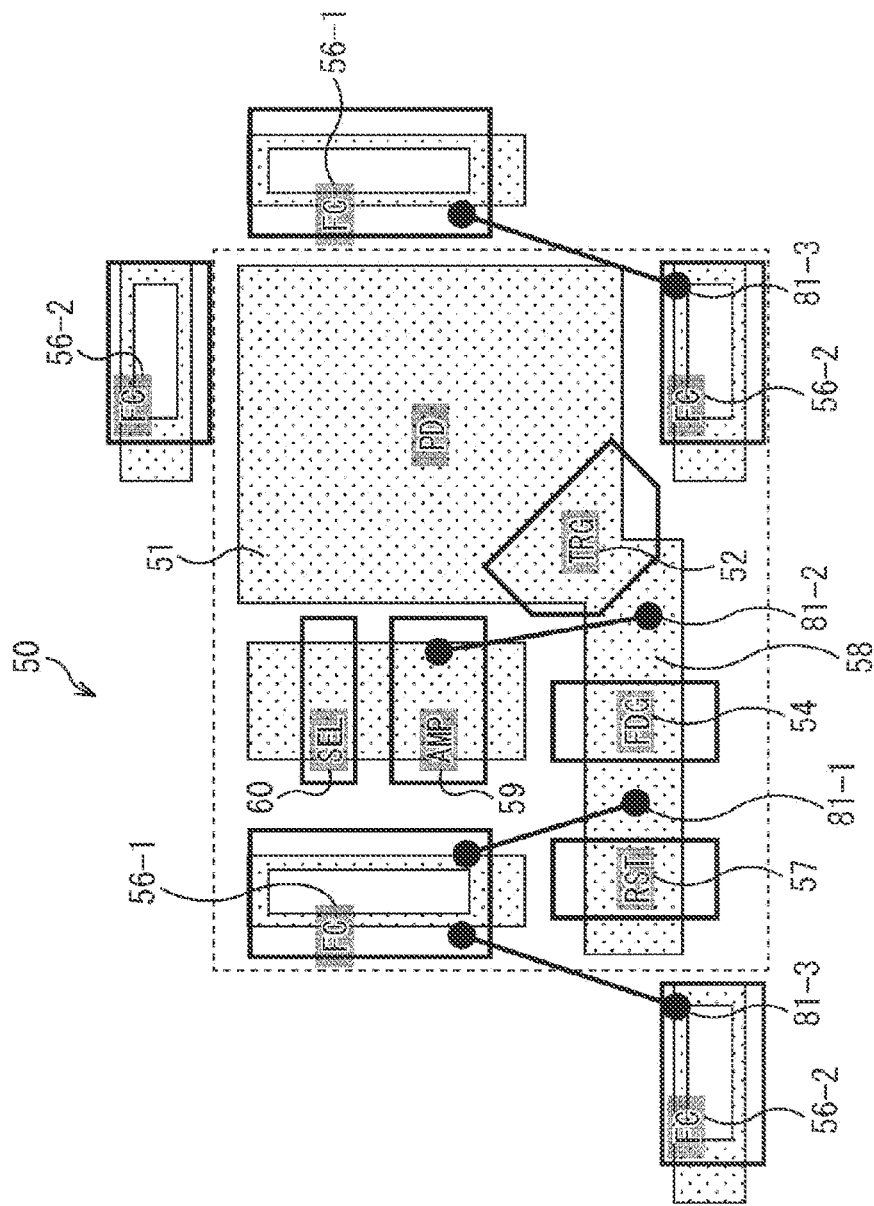
FIG. 8 is a plan view showing another configuration example of the unit pixel in FIG. 4.

FIG. 8 is a plan view showing a configuration example of the unit pixel in FIG. 4. FIG. 8 shows an example in which capacitance elements which are charge storage units 56-1 and 56-2 are placed in a plurality of directions with respect to the first photoelectric conversion unit 51, and a dashed line denotes a boundary of one unit pixel 50. In a plan view of FIG. 8, a wire 81-3 connecting the charge storage units 56-1 and 56-2 which are placed in a plurality of directions is shown, in addition to the wire 81-1 and the wire 81-2.

In the case of FIG. 8, the charge storage unit 56-1 is formed by boring of a trench which is vertically long in the figure in the substrate 70, and is placed along a longitudinal (Y-axis) direction of the first photoelectric conversion unit 51. The charge storage unit 56-2 is formed by boring of a trench which is horizontally long in the figure in the substrate 70, and is placed along a lateral (X-axis) direction of the first photoelectric conversion unit 51. As a result of this, the first photoelectric conversion unit 51 is shielded from the respective first photoelectric conversion units 51 in pixels adjacently placed in four directions.

It is noted that by configuring at least one of the charge storage units 56-1 and 56-2 so as to be connected to an adjacent pixel via the wire 81-3, for example, it is possible to improve area availability.

Figure 9:
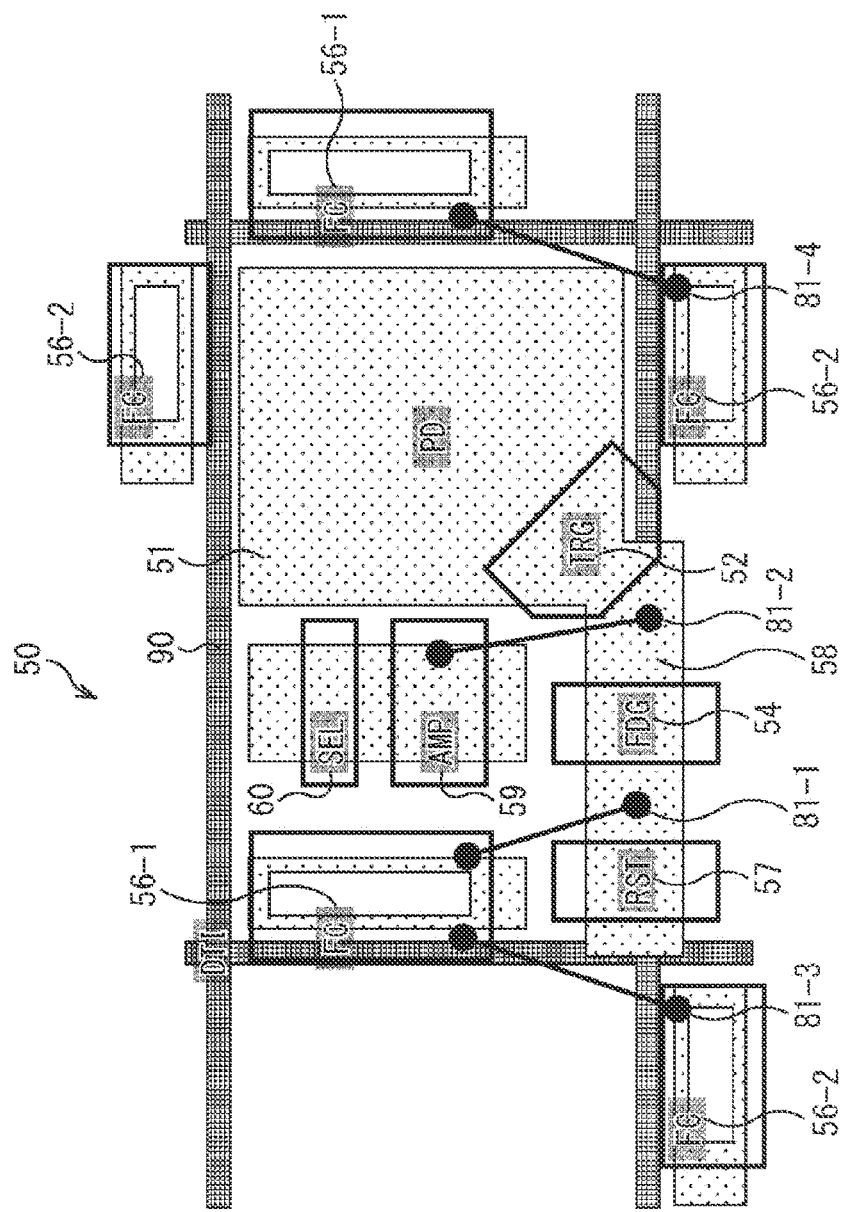
FIG. 9 is a plan view showing an example in which a DTI is additionally placed in the unit pixel in FIG. 8.

FIG. 9 is a plan view showing an example in which a DTI is additionally placed in the unit pixel in FIG. 8. In the example of FIG. 9, the DTI 90 is placed around a region of the unit pixel 50 which is surrounded by a dashed line in FIG. 8. As a result of this, the first photoelectric conversion units 51 are shielded from each other more securely.

{Cross-Sectional View of Charge Storage Unit}

FIGS. 10A, 10B, 10C, 11A, and 11B are cross-sectional views showing examples in which the charge storage unit according to the present technology is applied to the examples in FIGS. 5A, 5B, 5C, 6, 7, and 8. In each of those cross-sectional views, a lower side in the figure is a front-surface side upon which light is incident. As denoted by an arrow in FIG. 10A, the charge storage unit 56 has no light-shielding effect against light being incident at a large angle, and crosstalk inevitably occurs between the first photoelectric conversion unit 51 and its adjacent first photoelectric conversion unit 51.

Figure 10C:
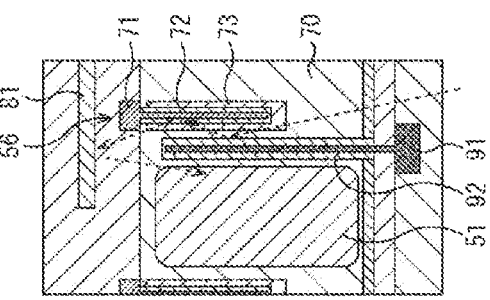
FIGS. 10A, 10B, and 10C are cross-sectional views showing another configuration example of a charge storage unit according to the present technology.
Figure 10B:
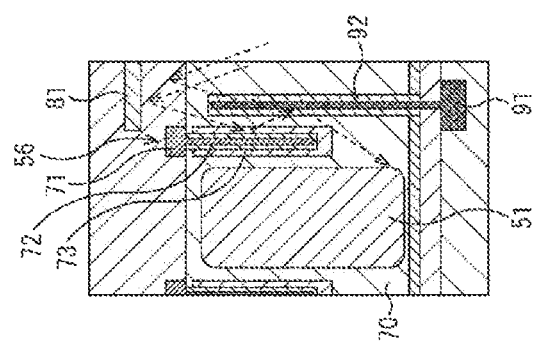
Figure 10A:
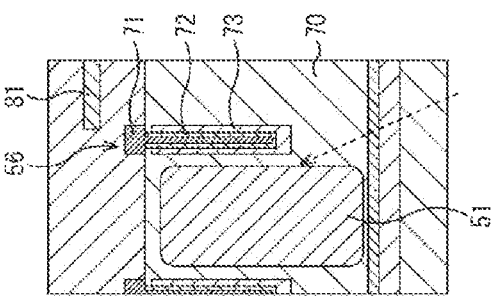

In contrast thereto, in a case of FIG. 10B, by further employing a reverse-side DTI (RDTI) 91 including an insulating layer 92, it is possible to block crosstalk of light being incident at a large angle which is denoted by a dashed-line arrow in FIG. 10A. However, in this case, crosstalk between the first photoelectric conversion unit 51 and its adjacent first photoelectric conversion unit 51 may possibly occur due to multiple reflection of light reflected from the wire 81, in the charge storage unit 56 and the RDTI 91, which is denoted by a dashed-line arrow in FIG. 11B.

Then, as shown in FIG. 10C, positions of the charge storage unit 56 and the RDTI 91 with respect to the first photoelectric conversion unit 51 are exchanged, so that crosstalk along a path denoted by a dashed-line arrow in FIG. 10B can be prevented. Nonetheless, even in a case of FIG. 10C, depending on a combination of an incident angle and a pattern of the wire 81, crosstalk between the first photoelectric conversion units 51 occurs in some cases as shown in FIG. 10C. Therefore, by selecting one of the structures in FIGS. 10B and 10C, considering an optical system and a wiring pattern which are to be employed, it is possible to minimize crosstalk.

Figure 11B:
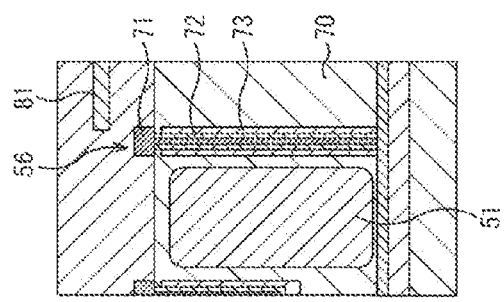
FIGS. 11A and 11B are cross-sectional views showing another different configuration example of the charge storage unit according to the present technology.
Figure 11A:
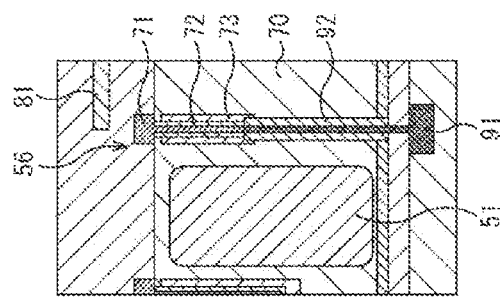

Also, by configuring the charge storage unit 56 which is a capacitance element, so as to penetrate a substrate as shown in FIG. 11A, or configuring the charge storage unit 56 which is a capacitance element, and the RDTI 91 so as to be joined to each other as shown in FIG. 11B, it is possible to improve a shielding effect.

{Plan View of Unit Pixel 50}

Figure 12:
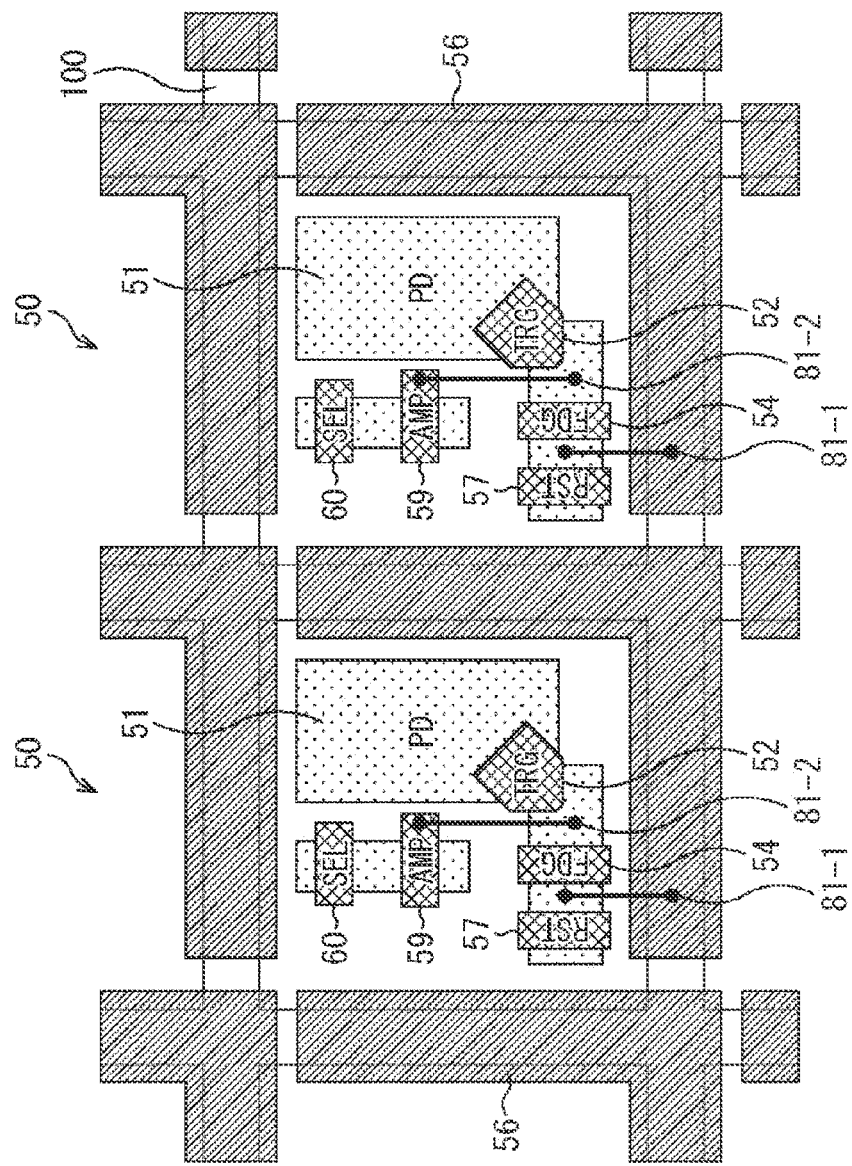
FIG. 12 is a plan view showing a configuration example of the unit pixel in FIG. 4.
Figure 13:
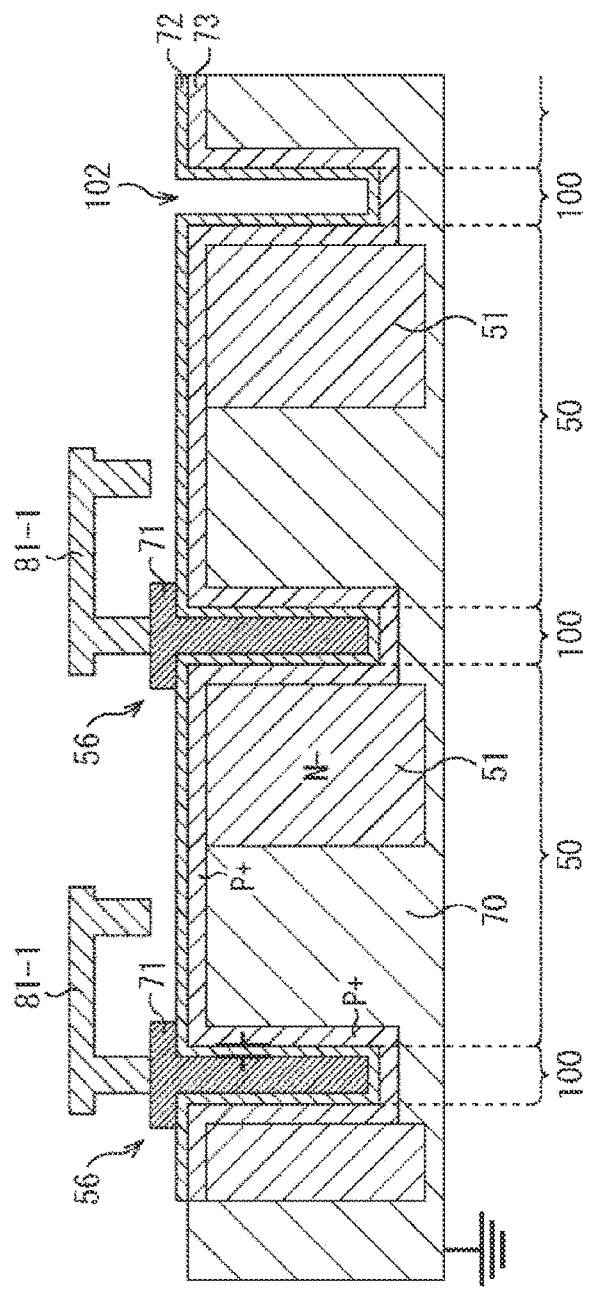
FIG. 13 is a cross-sectional view showing a configuration example of the unit pixel in FIG. 12.

FIG. 12 is a plan view showing an example of the unit pixel in FIG. 4, and FIG. 13 is a cross-sectional view of FIG. 12. FIG. 12 shows an example in which a capacitance element which is the charge storage unit 56 is used for a pixel isolating region 100 between the unit pixels 50 on the substrate 70.

The N$^-$-region first photoelectric conversion unit 51 is formed in a region of the unit pixel 50 on the substrate 70, and the charge storage unit 56 including the P$^+$-region diffusion layer 73, the insulating film 72, and the upper electrode 71 is formed in the pixel isolating region 100. For the upper electrode 71 including Poly-Si, the wire 81-1 connecting the upper electrode 71 of Poly-Si and a node is installed.

In this case, the charge storage unit 56 functions as a front-side DTI (FDTI), and a substrate-side electrode of the charge storage unit 56 functions as a PD isolation.

Next, by referring to a flow chart of FIG. 14, a forming process for the trench capacitor (charge storage unit 56) in FIG. 12 will be described. In description of FIG. 14, FIGS. 15, 16A, 16B, 16C, 16D, 17A, 17B, 18, 19A, and 19B will be referred to as appropriate. It is noted that the forming process of FIG. 14 is a process performed by a manufacturing apparatus for a solid-state imaging device (which will hereinafter be simply referred to as a manufacturing apparatus), for example.

As shown in a plan view of the pixel array unit 11 in FIG. 15, a region of the unit pixel 50 and the pixel isolating region 100 are formed in the substrate 70. FIGS. 16A, 16B, 16C, and 16D are cross-sectional views taken along a line A-A' in FIG. 15.

Figure 14:
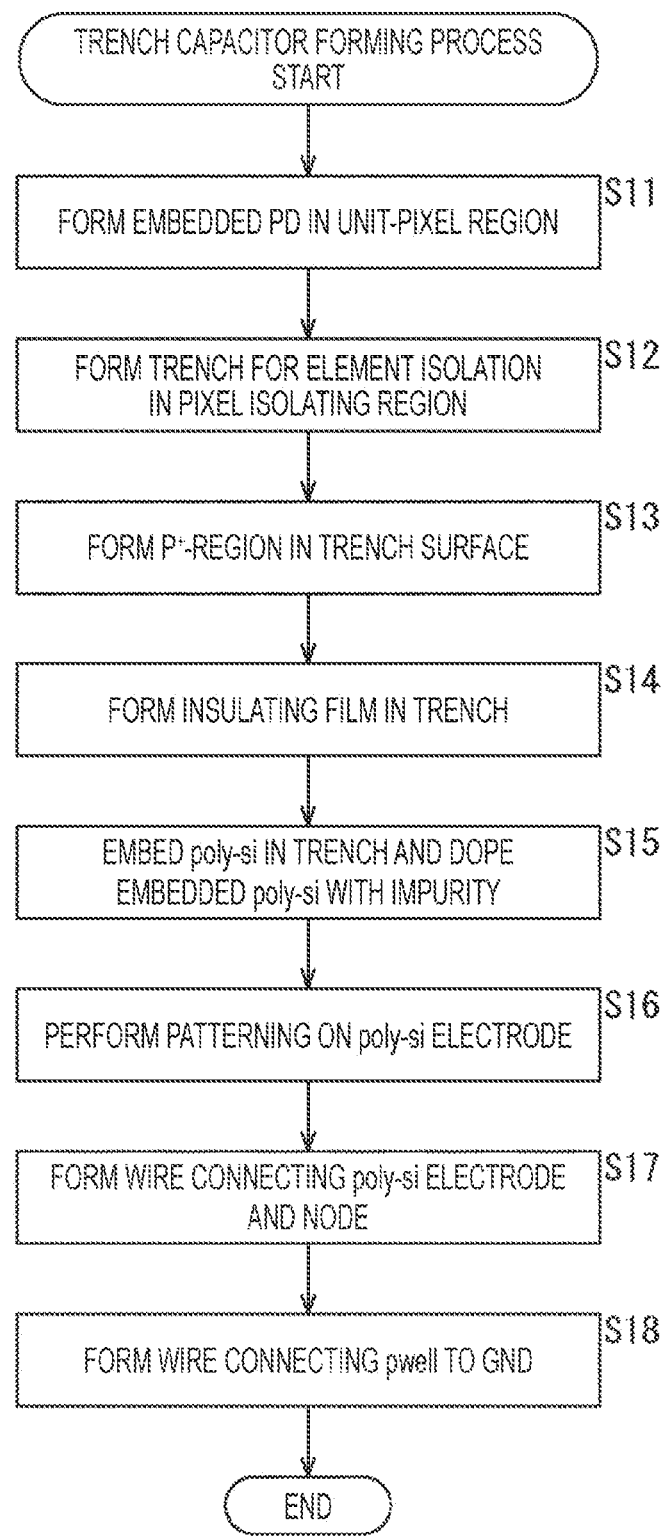
FIG. 14 is a flow chart which describes a forming process for a charge storage unit in FIG. 12.
Figure 16A:
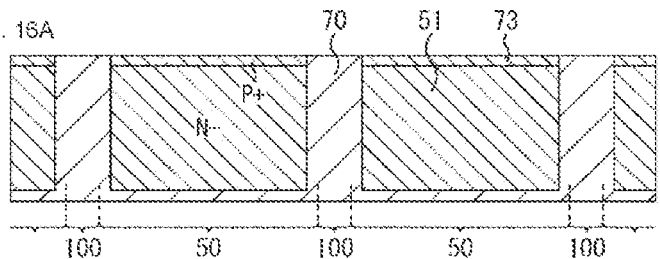
FIGS. 16A, 16B, 16C, and 16D are process charts showing an example of a forming process.

In step S11 of FIG. 14, the manufacturing apparatus forms an N$^-$-region embedded PD (the first photoelectric conversion unit 51) in a region of the unit pixel 50 on the substrate 70 (FIG. 16A).

Figure 16B:
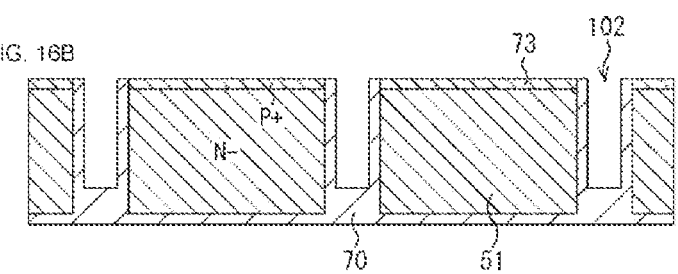

In step S12, the manufacturing apparatus forms a trench (hole or groove) 102 for element isolation in the pixel isolating region 100 (FIG. 16B).

Figure 16C:
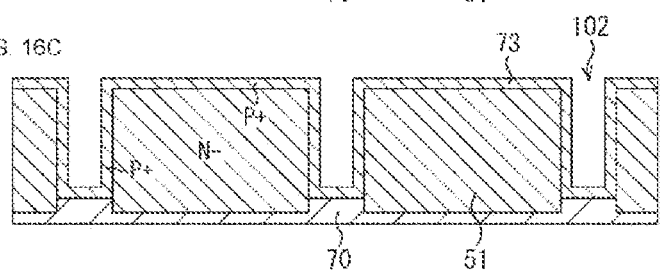
Figure 16D:
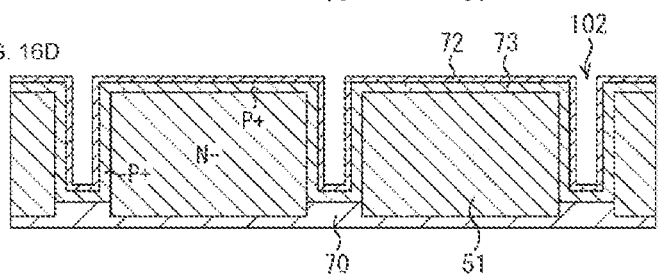

The manufacturing apparatus forms the P$^+$-region diffusion layer 73 in a surface of the trench 102 in step S13 (FIG. 16C). The manufacturing apparatus forms the insulating film 72 in the trench 102 in step S14 (FIG. 16D).

Figure 18:
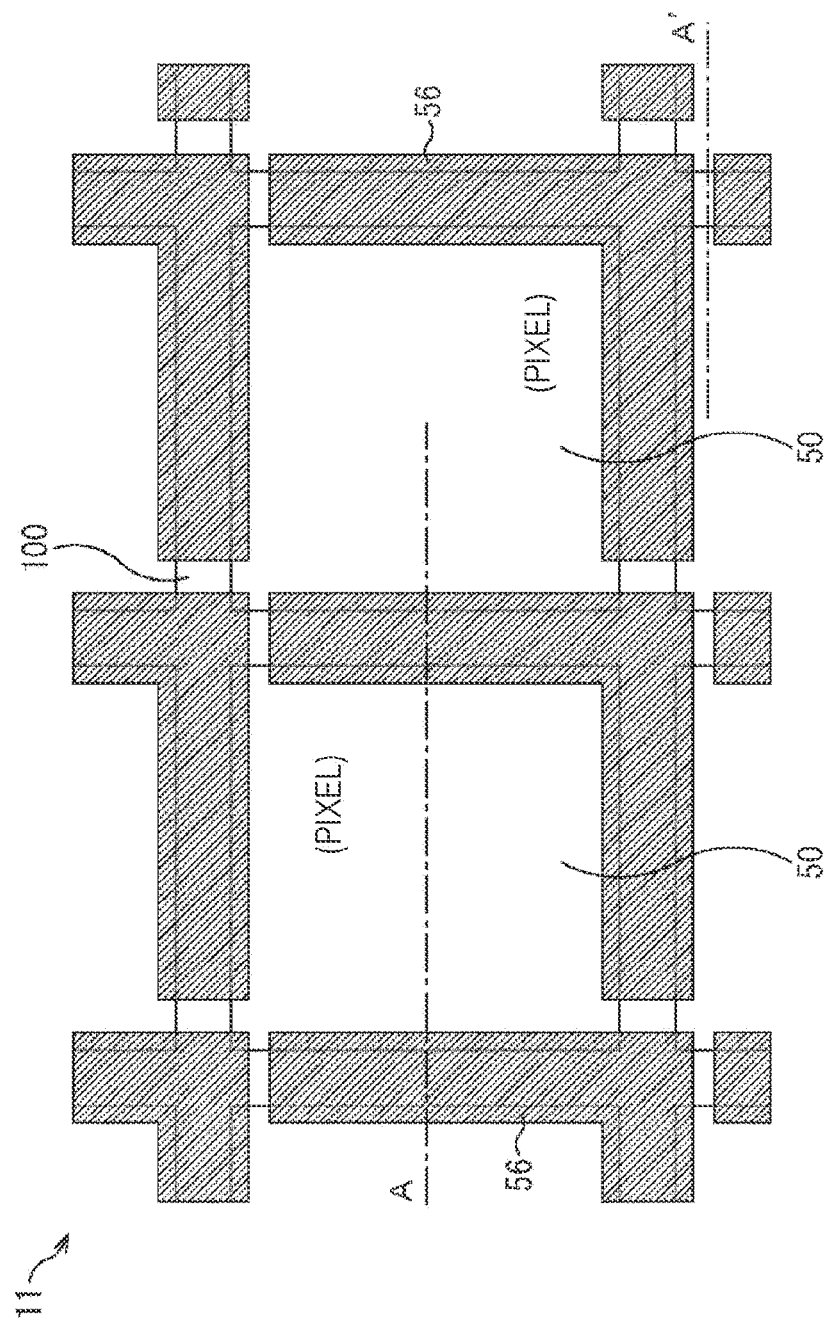
FIG. 18 is a plan view showing a configuration example of a pixel array unit.

The manufacturing apparatus embeds the upper electrode 71 of Poly-Si in the trench 102 and dopes the upper electrode 71 with an impurity in step S15 (FIG. 17A). The manufacturing apparatus performs patterning of the upper electrode 71 of Poly-Si in the trench 102 in step S16 (FIG. 17B). As a result of this, the charge storage unit 56 is formed in the pixel isolating region 100 as shown in FIG. 18.

Figure 19:
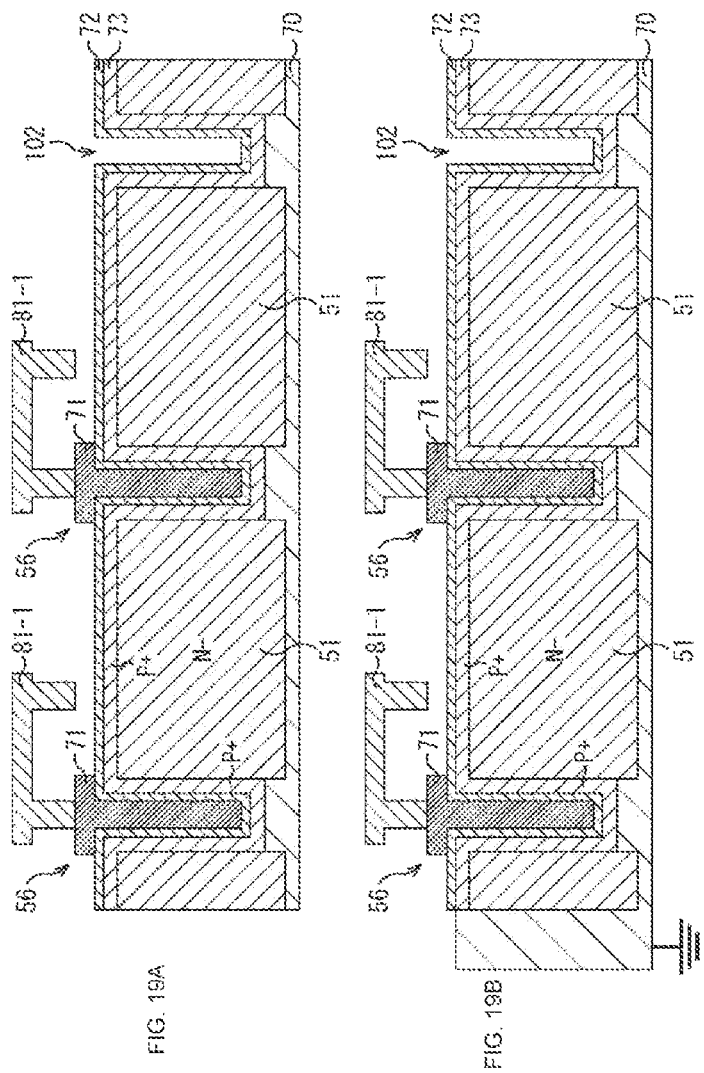
FIGS. 19A and 19B are process charts showing an example of a forming process.

The manufacturing apparatus forms the wire 81-1 connecting the upper electrode 71 of Poly-Si and a node in step S17 (FIG. 19A). The manufacturing apparatus forms a wire connecting the substrate 70 of a p-well to GND in step S18 (FIG. 19B).

In the above-described manner, a trench capacitor (the charge storage unit 56) is formed in the pixel isolating region 100 on the substrate 70 in FIG. 13.

As described above, according to the present technology, a trench capacitor is used as a charge storage unit, so that an effect of increasing a dynamic range can be produced by an increase of the maximum amount of charge in charge-to-voltage conversion without reducing a PD of a photoelectric conversion unit, and crosstalk of incident light and charge between PDs can be reduced. Accordingly, a dynamic range can be further increased, and linearity can be improved.

It is noted that in the above-described unit pixel 50 in FIG. 4, an overflow path may be formed in TRG (the first transfer gate 52) and FDG (the second transfer gate 54), to be used for an imaging device of a wide dynamic range (WDR) which performs a short/long-time charge storage and exposure, for example. At that time, in a case where excessive light is to be subjected to photoelectric conversion, a noise can be disregarded to some extent, so that there is no concern about a noise caused by light leaking into a capacitor. As a result of this, an upper electrode which does not shield a charge storage unit from light and is not depleted can be used as a node. That is, in this case, unlike a charge storage unit for a global shutter (GS), light shielding is unnecessary.

3. Second Embodiment (Circuit Configuration with Two PDs)

Next, a second embodiment of the present technology will be described.

(Circuit Configuration of Unit Pixel 150)

Figure 20:
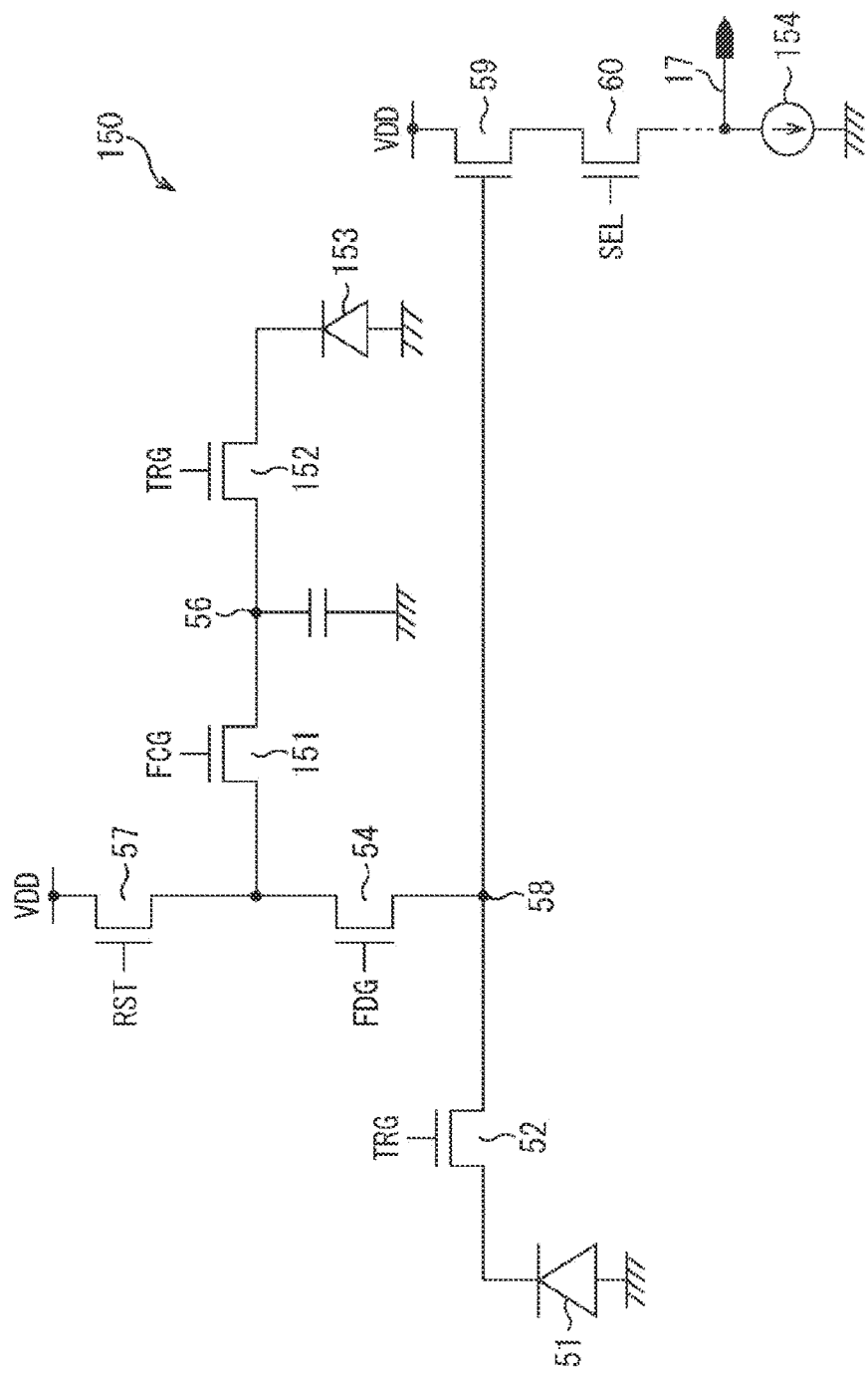
FIG. 20 is a circuit diagram showing a configuration example of a unit pixel according to a second embodiment of the present technology.

FIG. 20 is a circuit diagram showing a configuration example of a unit pixel 150 placed in a pixel array unit 11 in FIGS. 1 to 3.

The unit pixel 150 is similar to the unit pixel 50 in FIG. 4 in that the unit pixel 150 includes a first photoelectric conversion unit 51, a first transfer gate unit 52, a second transfer gate unit 54, a charge storage unit 56, a reset gate unit 57, a floating diffusion (FD) unit 58, an amplification transistor 59, and a selection transistor 60.

The unit pixel 150 is different from the unit pixel in FIG. 4 in that a third transfer gate unit 151, a fourth transfer gate unit 152, and a second photoelectric conversion unit 153 are added.

It is noted that for the unit pixels 150, a plurality of drive lines are installed as pixel drive lines 16 in FIGS. 1 to 3 so as to correspond to pixel columns, respectively, for example. Then, various kinds of drive signals TRG, TDG, FCG, TGS, RST, and SEL are fed from a vertical drive unit 12 in FIGS. 1 to 3 via the plurality of drive lines. Those drive signals are pulse signals which become active while being at a high level (a power supply voltage VDD, for example), and become inactive while being at a low level (a negative potential, for example), because each transistor of the unit pixel 150 is an NMOS transistor.

The first photoelectric conversion unit 51 includes a photodiode of a PN junction, for example. The first photoelectric conversion unit 51 generates and stores charge in accordance with an amount of received light.

The first transfer gate unit 52 is connected between the first photoelectric conversion unit 51 and the FD unit 58. The drive signal TRG is applied to a gate electrode of the first transfer gate unit 52. When the drive signal TRG becomes active, the first transfer gate unit 52 is placed in a conducting state, so that charge stored in the first photoelectric conversion unit 51 is transferred to the FD unit 58 via the first transfer gate unit 52.

The second transfer gate unit 54 is connected between the charge storage unit 56 and the FD unit 58. The drive signal FDG is applied to a gate electrode of the second transfer gate unit 54. The third transfer gate unit 151 is connected between the charge storage unit 56 and the FD unit 58. The drive signal FCG is applied to a gate electrode of the third transfer gate unit 151. When the drive signal FDG becomes active, the second transfer gate unit 54 is placed in a conducting state, and when the drive signal FCG becomes active, the second transfer gate unit 54 is placed in a conducting state, so that potentials of the charge storage unit 56 and the FD unit 58 are joined.

The fourth transfer gate unit 152 is connected between the second photoelectric conversion unit 153 and the charge storage unit 56. The drive signal TRG is applied to a gate electrode of the fourth transfer gate unit 152. When the drive signal TRG becomes active, the fourth transfer gate unit 152 is placed in a conducting state, so that charge stored in the second photoelectric conversion unit 153 is transferred to the charge storage unit 56 or a region where potentials of the charge storage unit 56 and the FD unit 58 are joined, via the fourth transfer gate unit 152.

Also, in a lower portion of a gate electrode of the fourth transfer gate unit 152, where a potential is somewhat deep, an overflow path which transfers charge which is present in an amount exceeding a saturation charge amount of the second photoelectric conversion unit 153 and overflows from the second photoelectric conversion unit 153, to the charge storage unit 56, is formed. It is noted that hereinafter, an overflow path formed in a lower portion of a gate electrode of the fourth transfer gate unit 152 will be simply referred to as an overflow path of the fourth transfer gate unit 152.

The charge storage unit 56 includes a capacitor, for example, and is connected between the third transfer gate unit 151 and the fourth transfer gate unit 152. A counter electrode of the charge storage unit 56 is connected between power supplies VDD which supply power-supply voltages VDD. It is noted that the counter electrode of the charge storage unit 56 is similar to that of the charge storage unit 56 in FIG. 4. The charge storage unit 56 stores charge which is to be transferred from the second photoelectric conversion unit 153.

The reset gate unit 57 is connected between the power supply VDD and the FD unit 58. The drive signal RST is applied to a gate electrode of the reset gate unit 57. When the drive signal RST becomes active, the reset gate unit 57 is placed in a conducting state, so that a potential of the FD unit 58 is reset to a level of the power supply voltage VDD. The FD unit 58 performs charge-to-voltage conversion, to convert charge to a voltage signal and output a resultant signal.

The second photoelectric conversion unit 153, like the first photoelectric conversion unit 51, includes a photodiode of a PN junction, for example. The second photoelectric conversion unit 153 generates and stores charge in accordance with an amount of received light.

When the first photoelectric conversion unit 51 and the second photoelectric conversion unit 153 are compared, the first photoelectric conversion unit 51 has a larger light-receiving surface and a higher sensitivity, and the second photoelectric conversion unit 153 has a smaller light-receiving surface and a lower sensitivity.

The amplification transistor 59 has a gate electrode connected to the FD unit 58 and has a drain electrode connected to the power supply VDD, and serves as an input unit of a reading circuit which reads out charge held in the FD unit 58, in other words, a so-called source follower circuit. That is, a source electrode of the amplification transistor 59 is connected to a vertical signal line 17 with the selection transistor 60 being interposed, so that the amplification transistor 59, together with a constant-current supply 154 which is connected to one end of the vertical signal line 17, forms a source follower circuit.

The selection transistor 60 is connected between a source electrode of the amplification transistor 59 and the vertical signal line 17. The drive signal SEL is applied to a gate electrode of the selection transistor 60. When the drive signal SEL becomes active, the selection transistor 60 is placed in a conducting state, so that the unit pixel 150 is placed in a selected state. As a result of this, a pixel signal output from the amplification transistor 59 is output to the vertical signal line 17 via the selection transistor 60.

Figure 21:
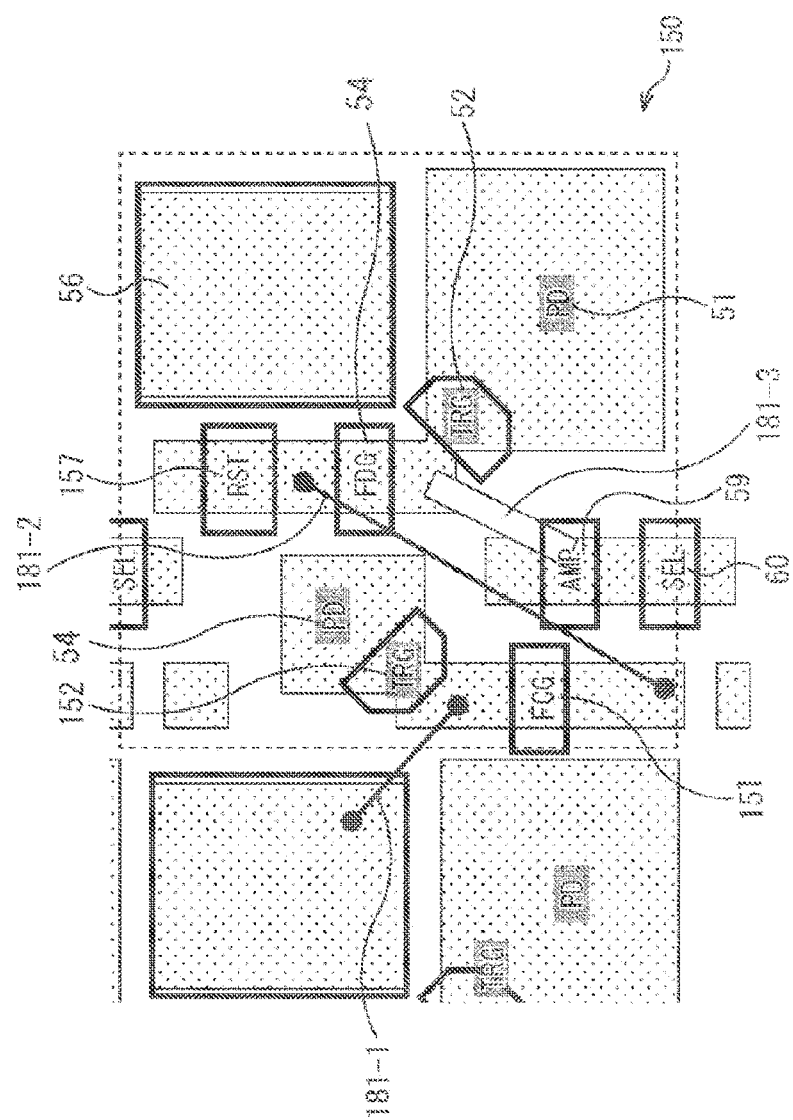
FIG. 21 is a plan view showing a configuration example of the unit pixel in FIG. 20.

FIG. 21 is a plan view showing a configuration example of the unit pixel in FIG. 20. FIG. 21 shows an example in which the capacitor described above with reference to FIGS. 5A, 5B, and 5C are employed as a capacitance element which is the charge storage unit 56. In a plan view of FIG. 21, a wire 81-1 connecting the charge storage unit 56 and the third transfer gate unit 151, a wire 81-2 connecting the third transfer gate unit 151 and the FD unit 58, and a wire 81-3 connecting the FD unit 58 and a gate electrode of the amplification transistor 59 are shown also.

That is, the charge storage unit 56 shown in FIG. 21 is not of a trench type, so that the PD 51 and the PD 153 are arranged in a limited manner in a surface of a substrate.

Figure 22A:
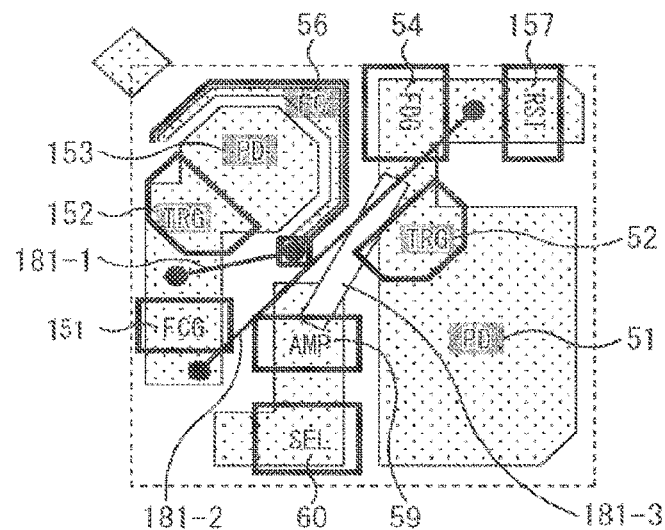
FIGS. 22A and 22B are views showing a configuration example of the unit pixel in FIG. 20.
Figure 22B:
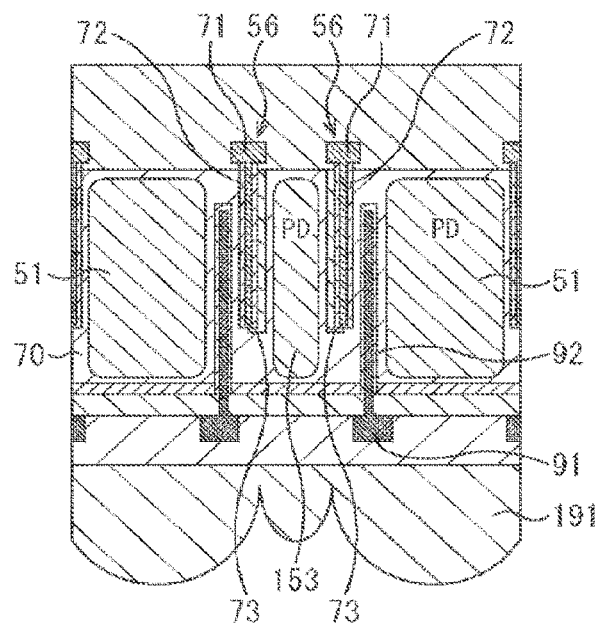

FIGS. 22A and 22B are plan views and a cross-sectional view, respectively, which show an example of the unit pixel in FIG. 20. It is noted that a plan view of FIG. 22A is a plan view seen from the side of a back surface which is not a front surface where an on-chip lens (OCL) 191 is placed, and in a cross-sectional view of FIG. 22B, a side where the OCL 191 is placed is shown in a lower side of the figure. FIG. 22A shows an example in which the trench capacitor described above with reference to FIG. 5C is employed as a capacitance element which is the charge storage unit 56.

Specifically, the charge storage unit 56 which is a trench capacitor of a type that is configured by boring of a hole as shown in FIG. 22B is placed so as to surround three sides of the second photoelectric conversion unit 153 having a smaller light-receiving surface and a lower sensitivity, as shown in FIG. 22A. In other words, the charge storage unit 56 is placed among the first photoelectric conversion unit 51 in the unit pixel 150, the first photoelectric conversion unit 51 in another unit pixel, and the second photoelectric conversion unit 153. Also, in the example of FIG. 22B, an RDTI 91 including an insulating layer 92 is further used.

As a result of using the charge storage unit 56 which is a trench capacitor, crosstalk between the first photoelectric conversion unit 51 and the second photoelectric conversion unit 153 is prevented, and a large region in a surface of a substrate is not occupied by the charge storage unit 56. Accordingly, the unit pixel 150 in FIG. 22A can make a surface area smaller than that of the unit pixel 150 in FIG. 21, and can suppress crosstalk.

As described above, by applying the trench capacitor according to the present technology to a solid-state imaging device including PDs which are a plurality of photoelectric conversion units having different sensitivities, in a pixel, it is possible to satisfactorily suppress moving-subject artifacts and increase a dynamic range without causing LED flicker.

4. Third Embodiment (Metal-Gate-Electrode Capacitor

Figure 23:
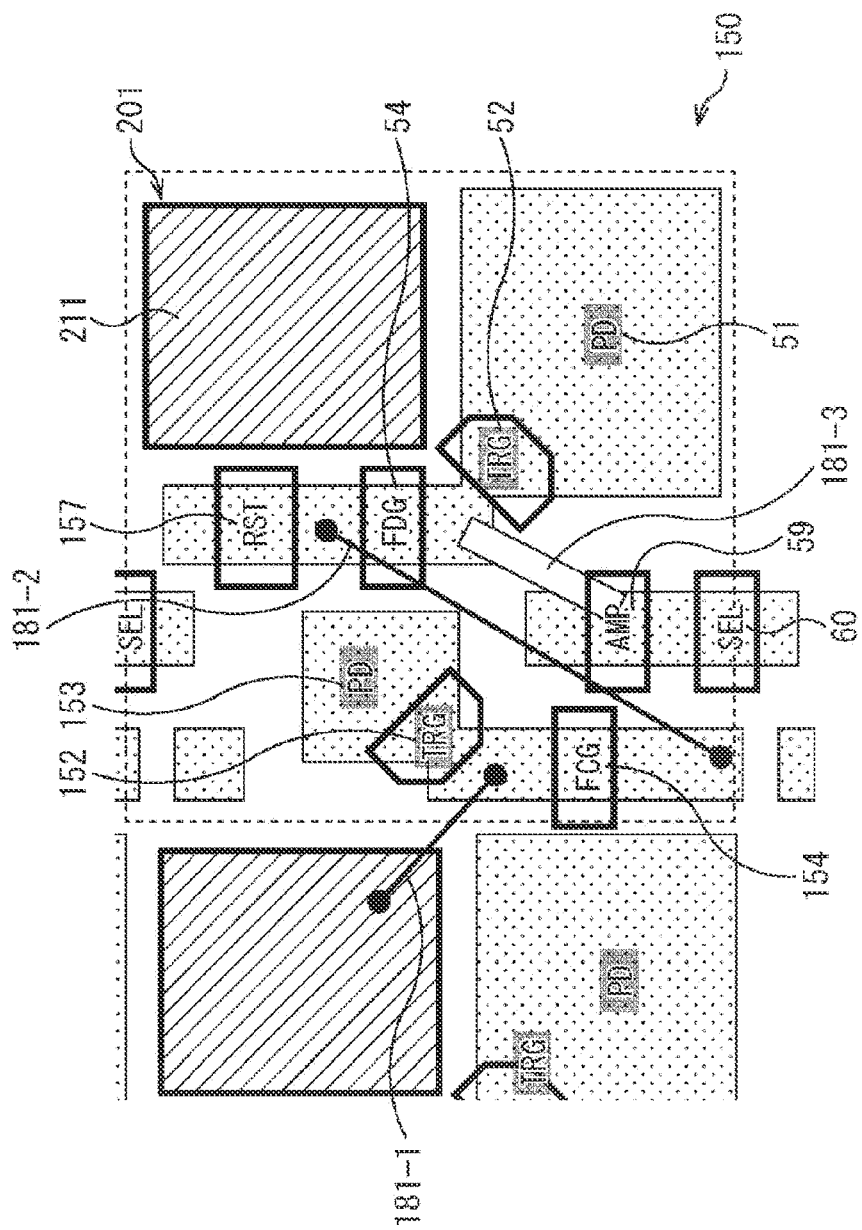
FIG. 23 is a plan view showing a configuration example of a unit pixel according to a third embodiment of the present technology.

Next, a third embodiment of the present technology will be described.
{Plan View of Unit Pixel 150}
FIG. 23 is a plan view of another example of the unit pixel 150 in FIG. 20. FIG. 23 shows an example in which a capacitor using a metal gate electrode 211 is employed as an upper electrode of a capacitance element which is a charge storage unit 56.

That is, the unit pixel 150 shown in FIG. 23 is different from the unit pixel 150 shown in FIG. 21 only in that a capacitor using the metal gate electrode 211 is employed as an upper electrode of a capacitance element which is the charge storage unit 56. The unit pixel 150 shown in FIG. 23 is similar to the unit pixel 150 shown in FIG. 21 in the other respects.

Figure 24:
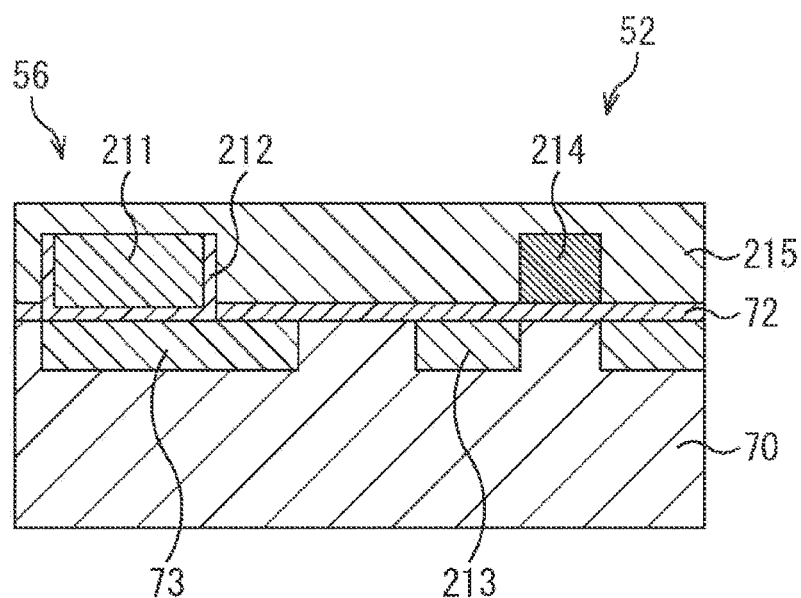
FIG. 24 is a cross-sectional view showing a configuration example of the unit pixel in FIG. 23.

{Cross-Sectional View of Unit Pixel 150}
FIG. 24 is a cross-sectional view showing a configuration example of the unit pixel 150 of FIG. 23. In this cross-sectional view, a lower side in the figure is a front-surface side upon which light is incident.

In the example of FIG. 24, the charge storage unit 56 includes the metal gate electrode 211 serving as an upper electrode, a High-k insulating film 212, and a diffusion layer 73. For the metal gate electrode 211, a metal having a high melting point such as Ti, TiN, or W, a compound thereof, or a laminate thereof, is used as a metal material, for example.

Figure 26:
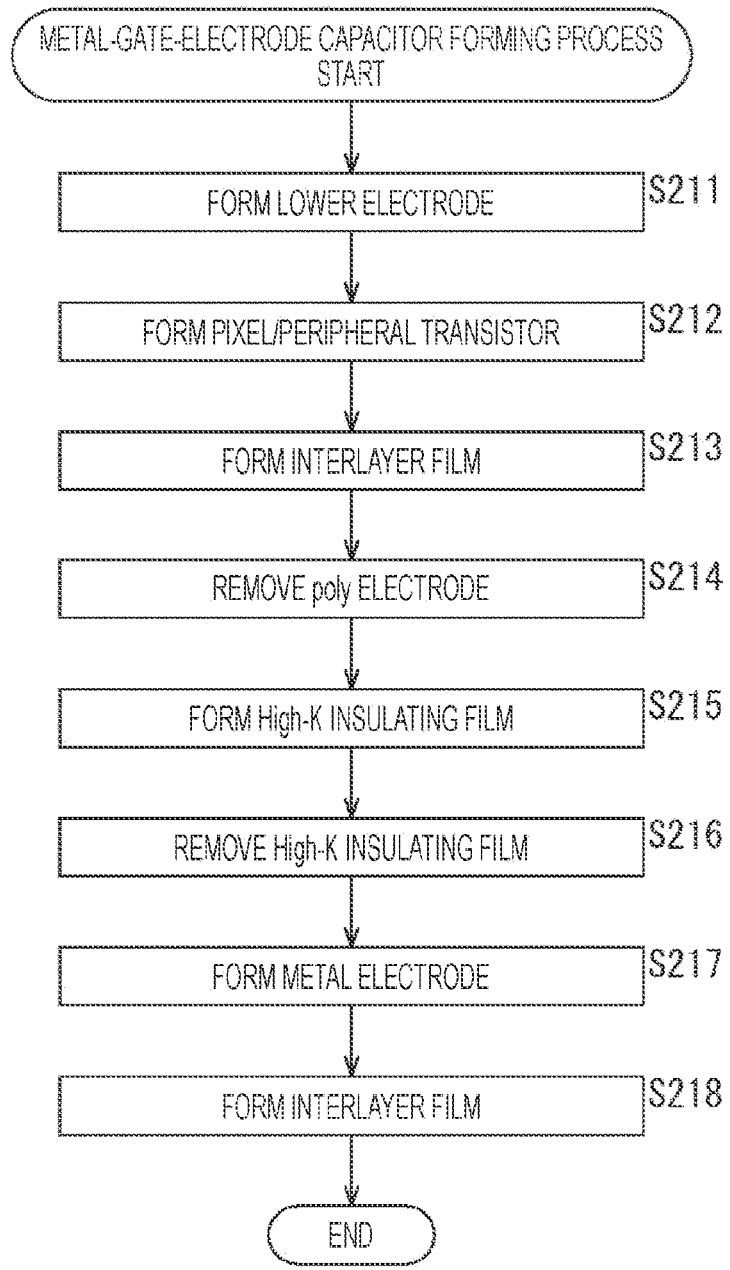
FIG. 26 is a flow chart which describes a forming process for a charge storage unit in FIG. 24.

The High-k insulating film 212 is formed so as to cover a bottom surface and a side surface of the metal gate electrode 211 in the figure. For the High-k insulating film 212, HF02, AL203, Ta205, or the like is used, for example. The charge storage unit 56 in this case, which will be described later with reference to FIG. 26, is placed simultaneously with a Poly-gate transistor in the unit pixel 150, such as a first transfer gate unit 52 (a poly electrode 214, a lower electrode (diffusion layer) 213, an insulating film 72 in the example of FIG. 24), for example.

Figure 25:
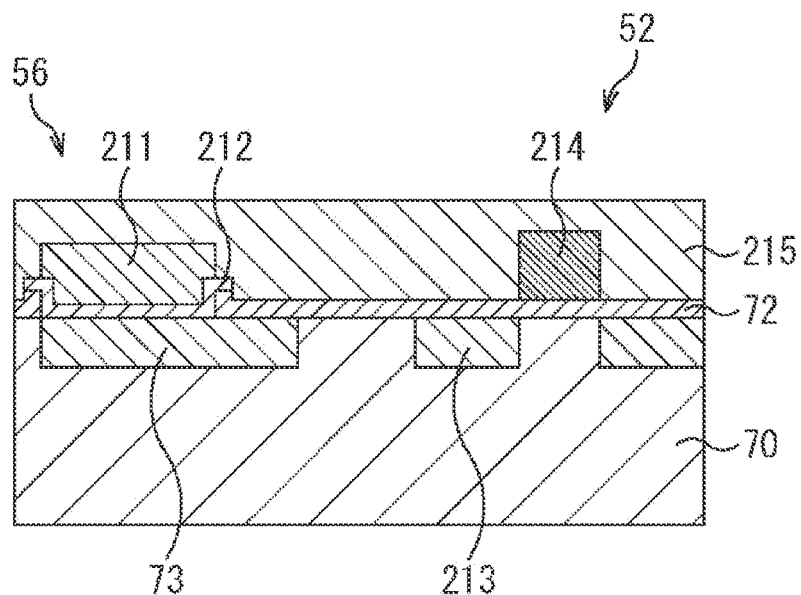
FIG. 25 is a cross-sectional view showing another configuration example of the unit pixel in FIG. 23.

It is noted that the High-k insulating film 212 is formed with a recess in a side surface of the metal gate electrode 211 such that only a surface being connected to the diffusion layer 73 becomes smaller, as shown in FIG. 25 which will be next referred to.

FIG. 25 is a cross-sectional view showing an example of the unit pixel 150 of FIG. 23. In this cross-sectional view, a lower side in the figure is a front-surface side upon which light is incident.

In the example of FIG. 25, the charge storage unit 56 includes the metal gate electrode 211 serving as an upper electrode, the High-k insulating film 221, and the diffusion layer 73.

The High-k insulating film 221 is formed so as to cover a bottom surface and a side surface of the metal gate electrode 211 in the figure. It is noted that at that time, the High-k insulating film 221 is formed with a recess in a side surface of the metal gate electrode 211 such that only a surface being connected to the diffusion layer 73 becomes smaller as shown in FIG. 25. Also, the charge storage unit 56 in FIG. 25 is formed in such a manner that the High-k insulating film 221 is formed earlier than that in a forming process for the charge storage unit 56 in the example of FIG. 24.

It is noted that the charge storage unit 56 in FIG. 24 or FIG. 25 may include a trench capacitor formed by boring of a hole in a substrate 70.

Next, with reference to a flow chart of FIG. 26, a forming process for a metal-gate-electrode capacitor (the charge storage unit 56 in FIG. 24) will be described. In description of FIG. 26, FIGS. 27A, 27B, 27C, 28A, 28B, 28C, 29A, and 29B will be referred to as appropriate. It is noted that the forming process in FIG. 26 is a process performed by a manufacturing apparatus for a solid-state imaging device (which will hereinafter be simply referred to as a manufacturing apparatus), for example.

Figure 27A:
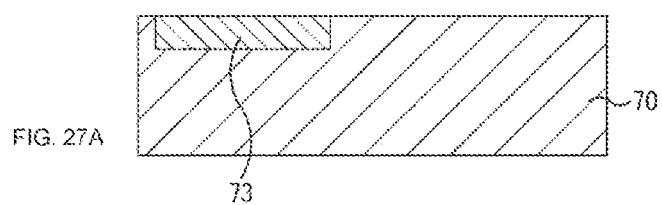
FIGS. 27A, 27B, and 27C are process charts showing an example of a forming process.
Figure 27B:
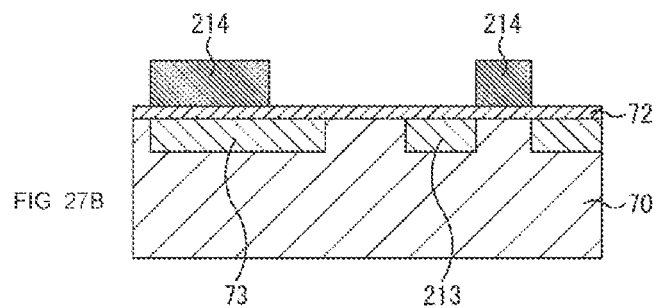
Figure 27C:
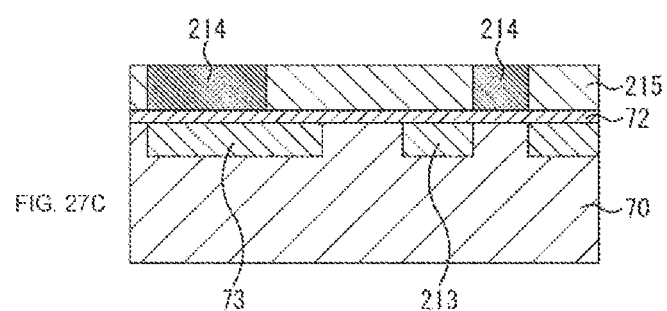

In step S211, the manufacturing apparatus forms the diffusion layer 73 as a lower electrode in the substrate 70 (FIG. 27A). In step S212, the manufacturing apparatus forms a pixel/peripheral transistor. More specifically, the manufacturing apparatus forms the insulating film 72 after forming the lower electrode 213 of the pixel/peripheral transistor, and then forms a poly electrode 214 (FIG. 27B). In step S213, the manufacturing apparatus forms an interlayer film 215 on the poly electrode 214 having been formed (FIG. 27C).

Figure 28A:
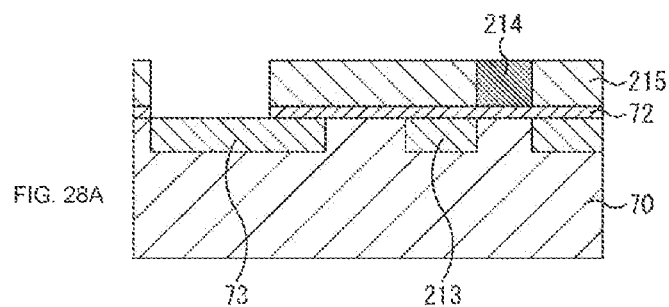
FIGS. 28A, 28B, and 28C are process charts showing an example of a forming process.
Figure 28B:
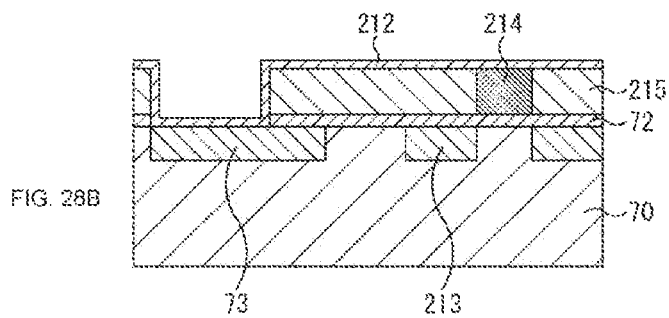

In step S214, the manufacturing apparatus removes the poly electrode 214 of the charge storage unit 56 (FIG. 28A). In step S215, the manufacturing apparatus forms the High-k insulating film 212 after removing the poly electrode 214 (FIG. 28B).

Figure 28C:
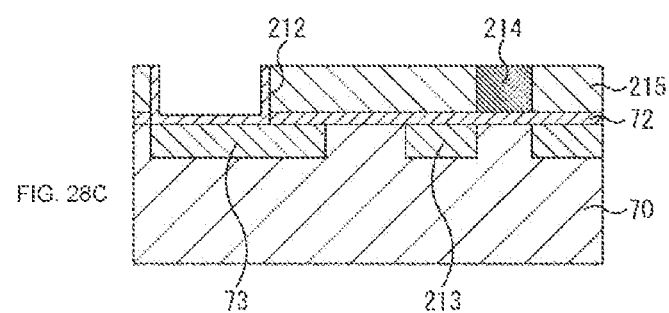
Figure 29A:
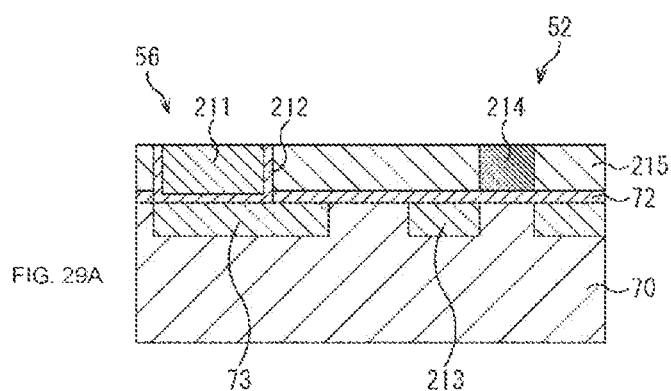
FIGS. 29A and 29B are process charts showing an example of a forming process.
Figure 29B:
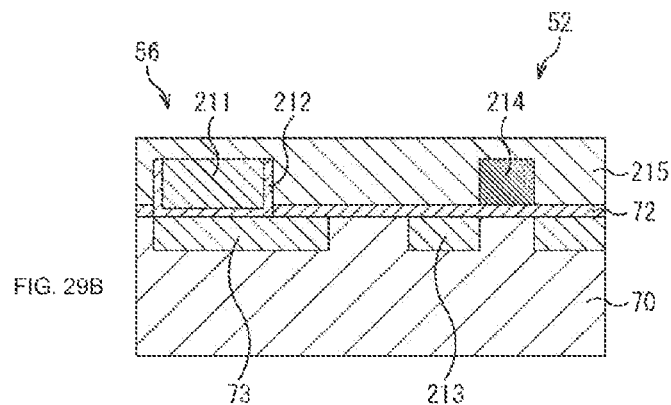

In step S216, the manufacturing apparatus removes an unnecessary portion of the High-k insulating film 212 (FIG. 28C). In step S217, the manufacturing apparatus forms the metal gate electrode 211 (FIG. 29A). In step S218, the manufacturing apparatus forms the interlayer film 215 (FIG. 29B), so that the forming process for the charge storage unit 56 is finished.

Figure 30:
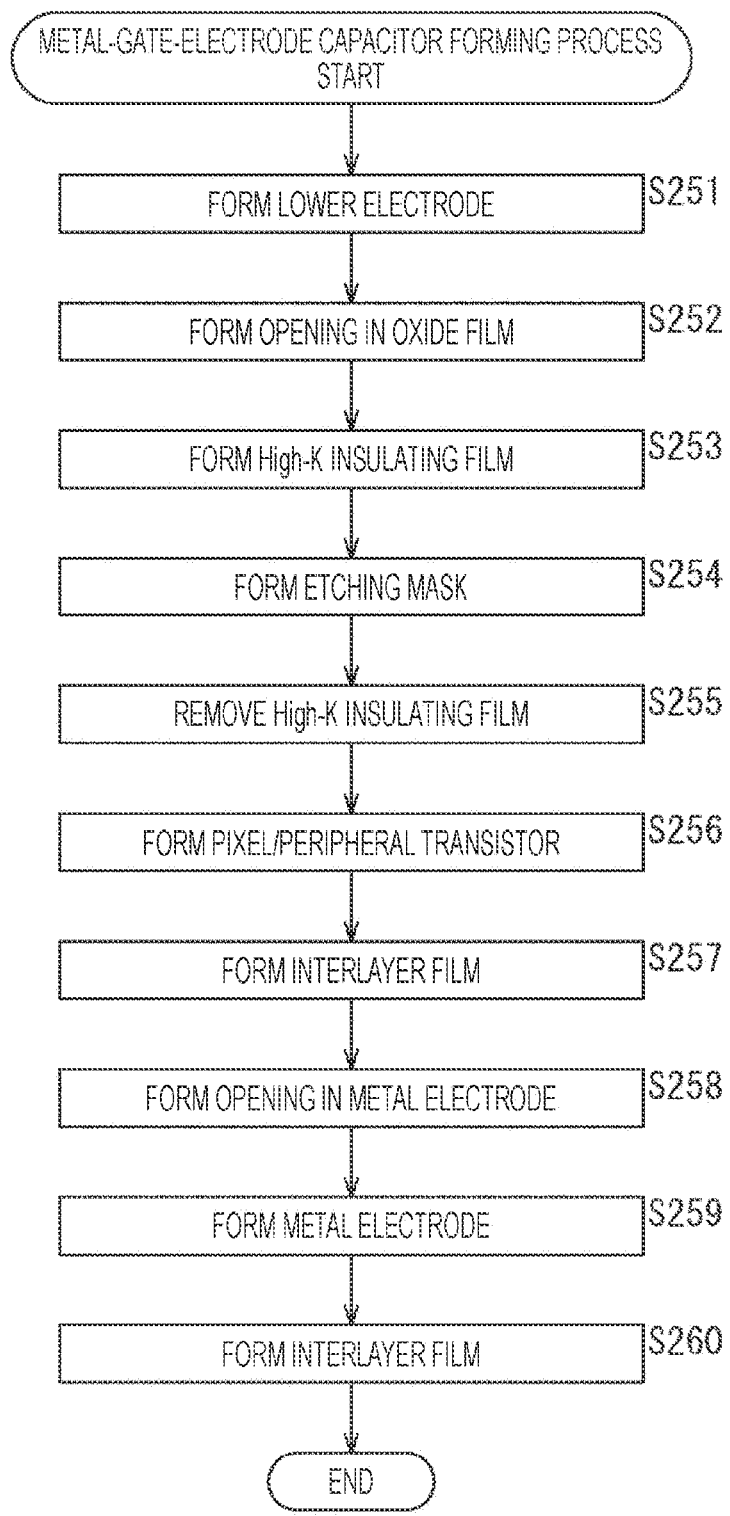
FIG. 30 is a flow chart which describes a forming process for a charge storage unit in FIG. 25.

Next, with reference to a flow chart in FIG. 30, a forming process for a metal-gate-electrode capacitor (the charge storage unit 56 in FIG. 25) will be described. In description of FIG. 30, FIGS. 31A, 31B, 31C, 32A, 32B, 32C, 33A, 33B, 33C, and 33D will be referred to as appropriate. It is noted that the forming process in FIG. 30 is a process performed by a manufacturing apparatus for a solid-state imaging device (which will hereinafter be simply referred to as a manufacturing apparatus), for example.

Figure 31A:
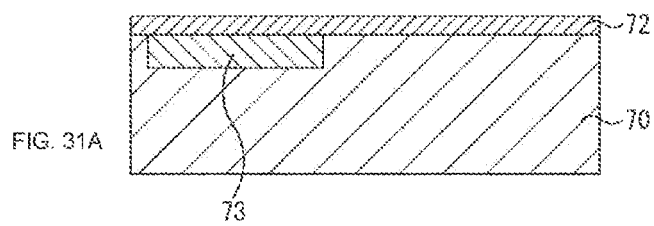
FIGS. 31A, 31B, and 31C are process charts showing an example of a forming process.
Figure 31B:
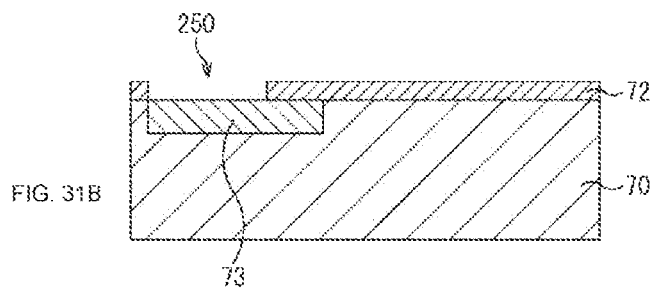
Figure 31C:
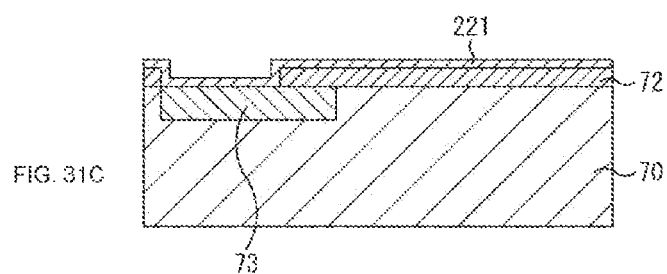

In step S251, the manufacturing apparatus forms the diffusion layer 73 as a lower electrode in the substrate 70, and forms the insulating film 72 (FIG. 31A). In step S252, the manufacturing apparatus forms an opening in an oxide film 250 (FIG. 31B). In step S253, the manufacturing apparatus forms the High-k insulating film 221 (FIG. 31C).

Figure 32A:
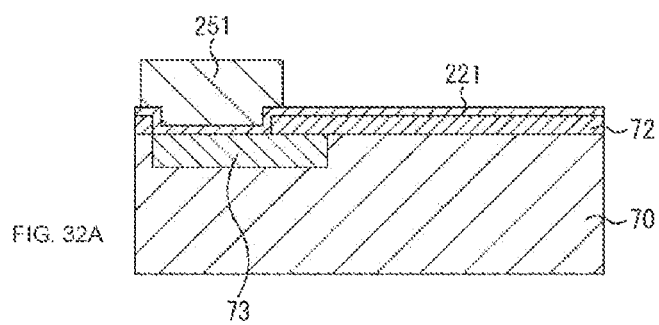
FIGS. 32A, 32B, and 32C are process charts showing an example of a forming process.
Figure 32B:
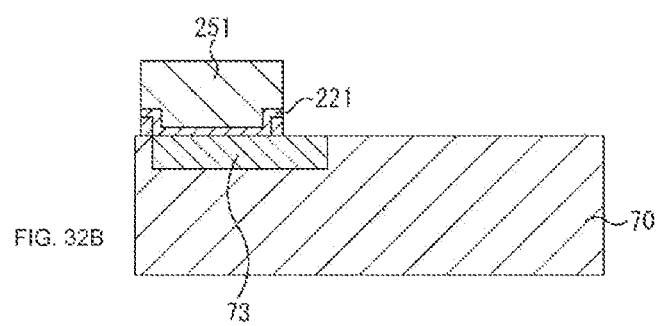
Figure 32C:
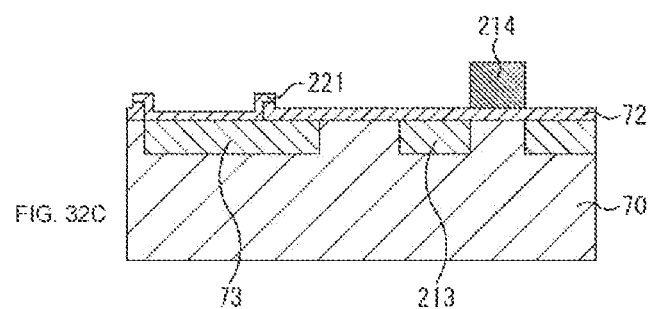

In step S254, the manufacturing apparatus forms an etching mask 251 (FIG. 32A). In step S255, the manufacturing apparatus removes the High-k insulating film 221 (FIG. 32B). In step S256, the manufacturing apparatus forms a pixel/peripheral transistor. More specifically, the manufacturing apparatus forms the insulating film 72 after forming the lower electrode 213 of the pixel/peripheral transistor, and thereafter forms the poly electrode 214 (FIG. 32C).

In step S257, the manufacturing apparatus forms the interlayer film 215 (FIG. 33A). In step S258, the manufacturing apparatus forms an opening in an unnecessary portion 252 of the interlayer film 215 (FIG. 33B). In step S259, the manufacturing apparatus forms the metal gate electrode 211 (FIG. 33C). In step S260, the manufacturing apparatus forms the interlayer film 215 (FIG. 33D), so that the forming process for the charge storage unit 56 is finished.

In the example of FIG. 21 in which a plurality of PDs having different sensitivities are provided in a unit pixel, a capacitor which performs charge-to-voltage conversion on photo-charge generated in a PD having a lower sensitivity is connected, and thus, a pixel size is reduced in order to reduce an optical size and increase the number of pixels, so that a dynamic range is reduced due to reduction of a capacity of a capacitance element. Also, crosstalk increases due to reduction in a space between PDs, resulting in degradation of linearity.

However, in the present technology, because of use of a metal-gate-electrode capacitor as a charge storage unit, it is possible to suppress reduction of a capacity of a capacitor which has a high capacity because of inclusion of a High-k insulating film, and reduction of a capacity of an upper (poly) electrode which is caused due to depletion of the upper electrode at a time when the upper electrode is at a positive potential. As a result of this, reduction of a dynamic range can be prevented.

Also, compatibility with a low-noise pixel transistor can be achieved, so that increase of crosstalk can be prevented and degradation of linearity can be suppressed.

5. Fourth Embodiment (Trench-Shaped Element Isolation of a Circuit with Two PDs

Figure 34:
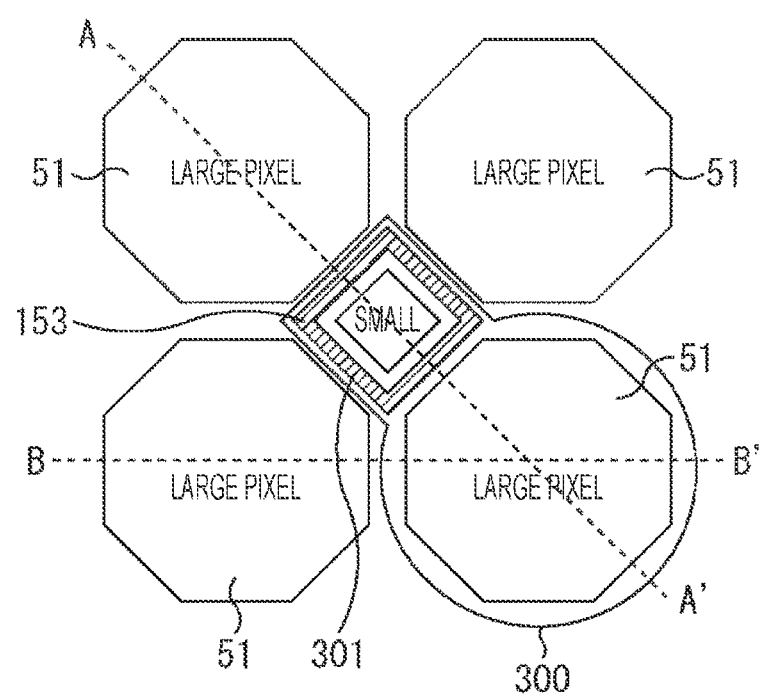
FIG. 34 is a plan view showing a configuration example of a unit pixel according to a fourth embodiment of the present technology.
Figure 35B:
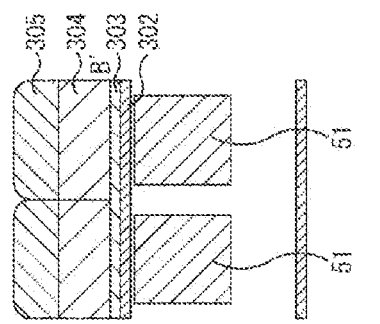
FIGS. 35A and 35B are cross-sectional views showing a configuration example of the unit pixel in FIG. 34.
Figure 35A:
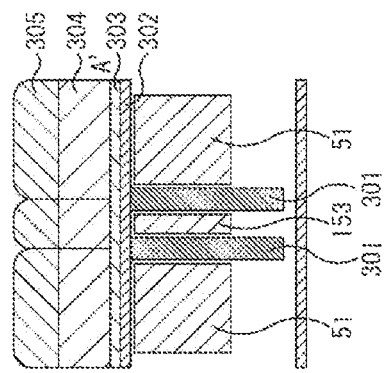

Next, a fourth embodiment of the present technology will be described.
{Plan View of Unit Pixel 300 in Pixel Array Unit 11}
FIG. 34 is a plan view showing a configuration example of a unit pixel 300 in FIG. 20 which is placed in a pixel array unit 11 in FIGS. 1 to 3. FIGS. 35A and 35B are cross-sectional views showing a configuration example of the unit pixel in FIG. 34. FIG. 35A shows an example of a section taken along a line A-A' in FIG. 34, and FIG. 35B shows an example of a section taken along a line B-B' in FIG. 34.

The unit pixel 300 is configured similarly to the unit pixel 150 in FIG. 20. More specifically, the unit pixel 300 includes a first photoelectric conversion unit 51 and a second photoelectric conversion unit 153. When the first photoelectric conversion unit 51 and the second photoelectric conversion unit 153 are compared, the first photoelectric conversion unit 51 has a larger light-receiving surface and a higher sensitivity, and the second photoelectric conversion unit 153 has a smaller light-receiving surface and a lower sensitivity.

In the example of FIG. 34, a trench-shaped element isolation 301 having a depth larger than that of the first photoelectric conversion unit 51 and the second photoelectric conversion unit 153 is formed so as to surround only the second photoelectric conversion unit 153 having a smaller light-receiving surface, in a substrate 70.

An antireflection film 302 and a planarizing film 303 are formed on the substrate 70 in which the first photoelectric conversion unit 51, the second photoelectric conversion unit 153, and the element isolation 301 are embedded, and a color filter 304 and an on-chip lens 305 are provided for each photoelectric conversion unit, on the films 302 and 303.

Figure 36:
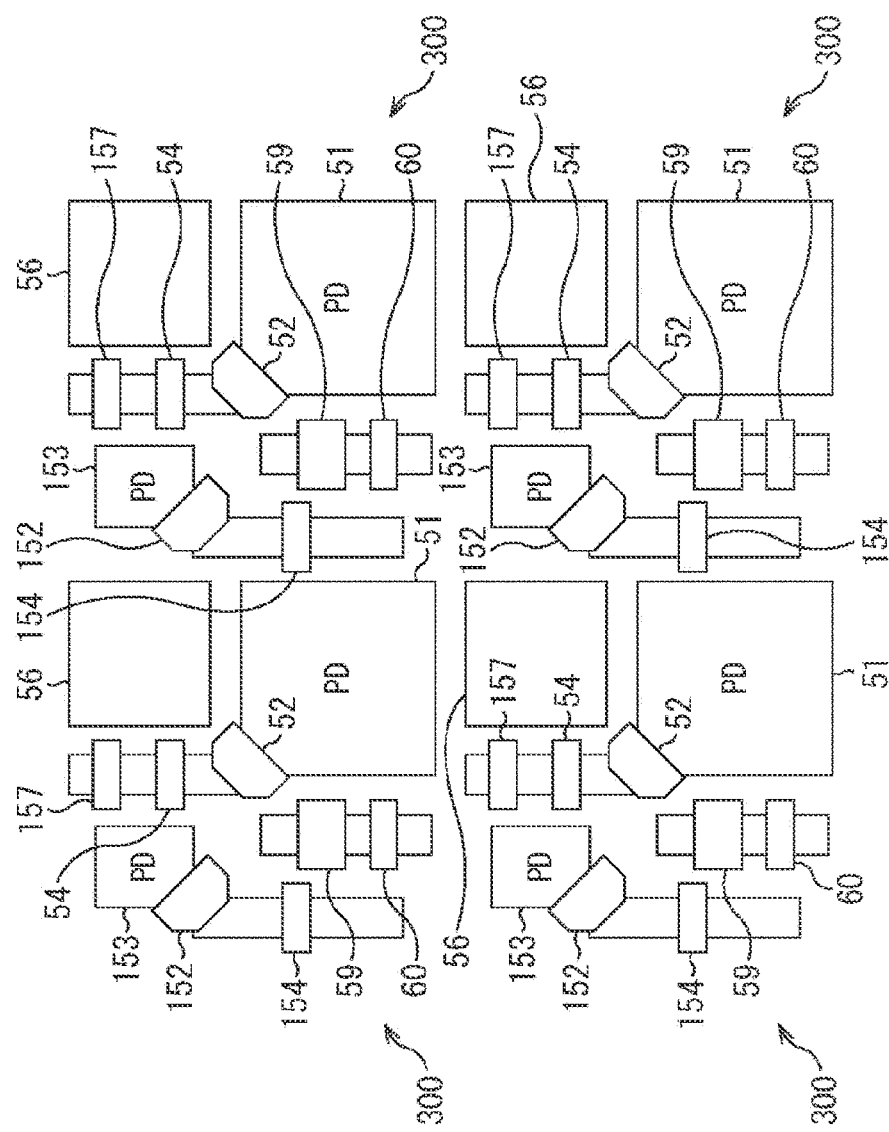
FIG. 36 is a plan view showing an example of arrangement of four unit pixels in a pixel array unit.

FIG. 36 is a plan view of four unit pixels 300 in the pixel array unit 11 in FIG. 34. In the example of FIG. 36, there is a plan view seen from a front-surface side which is a side opposite to a surface of the silicon substrate 70 upon which light is incident. In the example of FIG. 36, the four unit pixels 300 are laid out similarly to the unit pixels described above with reference to FIG. 20.

Figure 37:
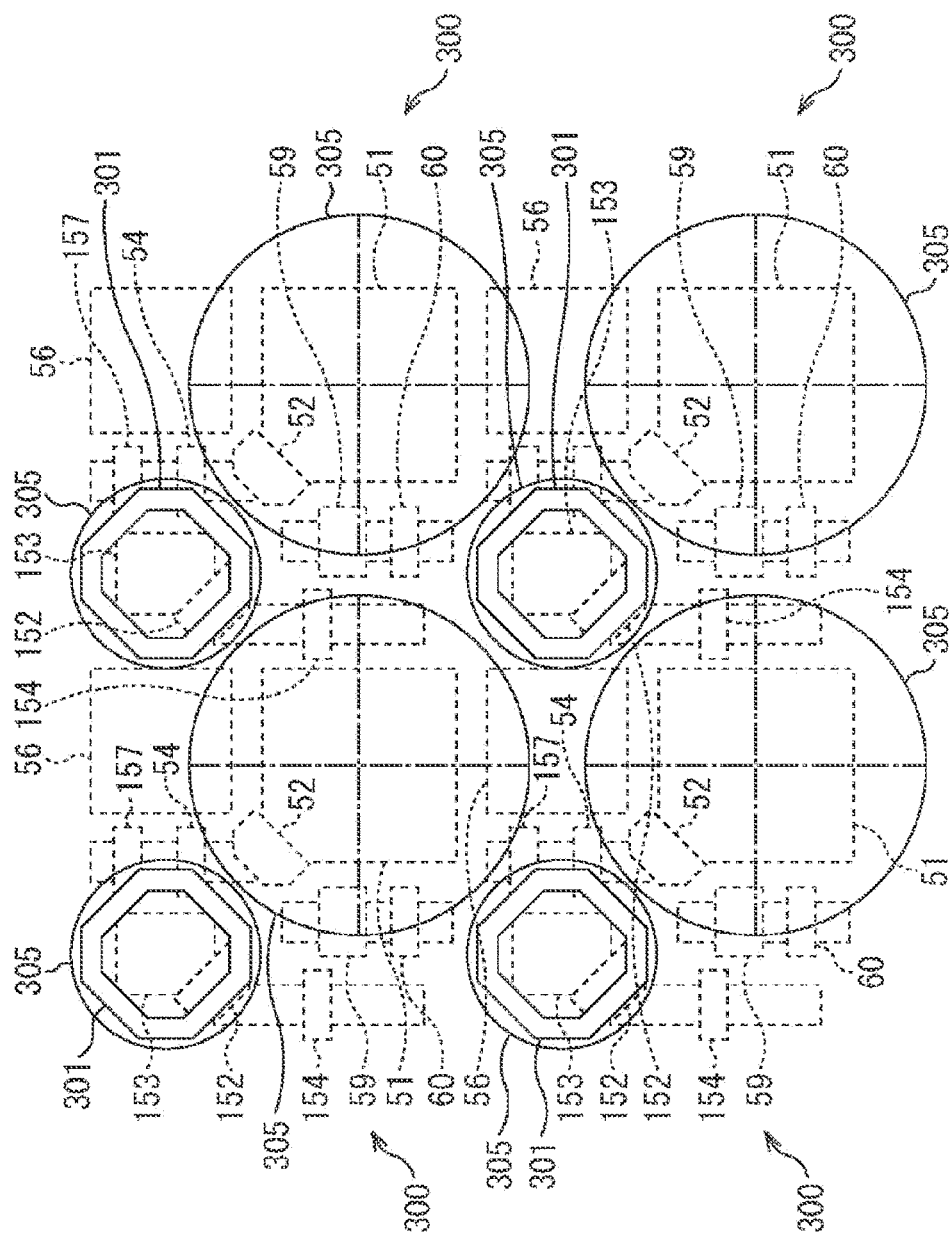
FIG. 37 is a plan view showing an example of arrangement of element isolations and on-chip lenses on a front-surface side.
Figure 38:
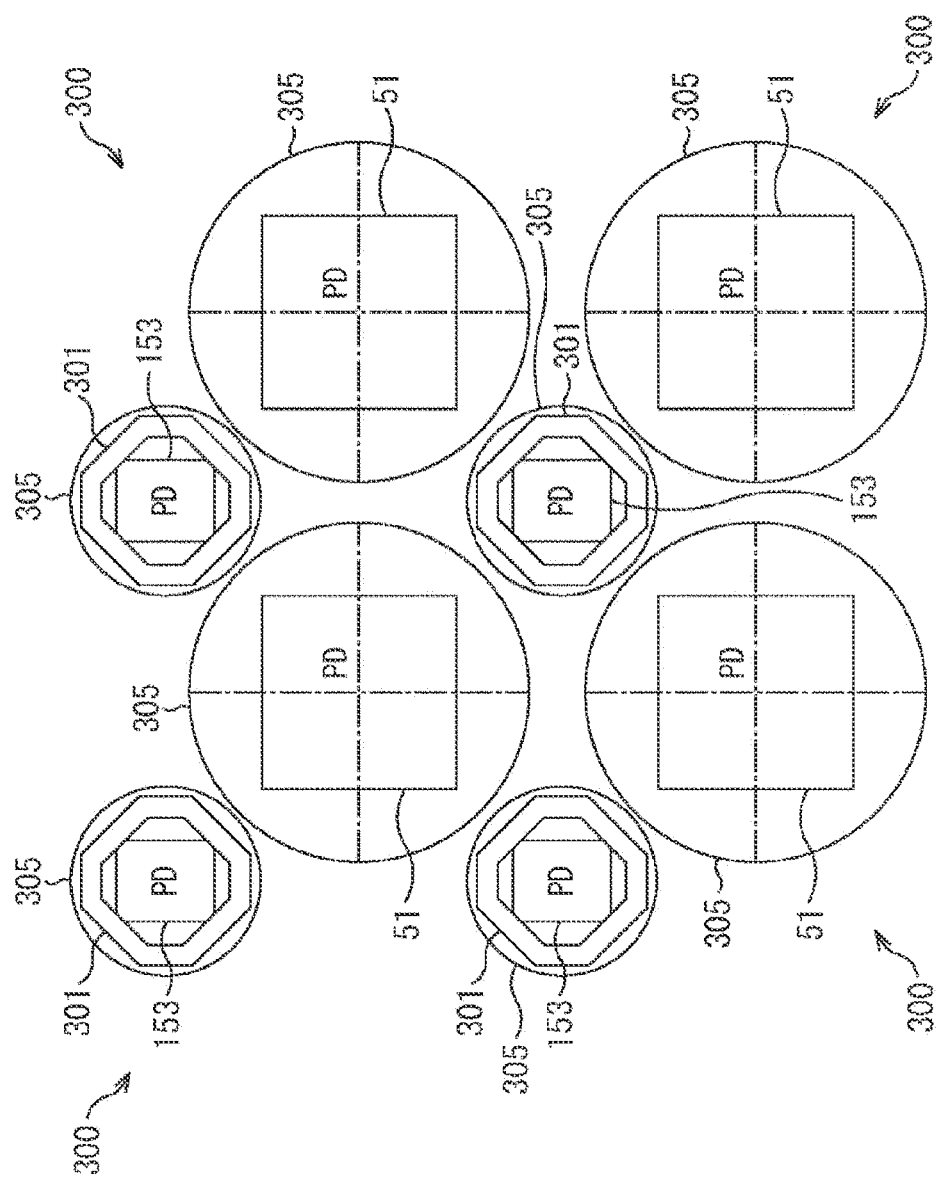
FIG. 38 is a plan view showing an example of arrangement of element isolations and on-chip lenses on a back-surface side.

FIG. 37 shows arrangement of the element isolations 301 and the on-chip lenses 305 in a plan view of FIG. 36 which is seen from a front-surface side. FIG. 38 shows a positional relationship among the first photoelectric conversion units 51, the second photoelectric conversion units 153, the element isolations 301, and the on-chip lenses 305 in a plan view seen from a back-surface side, in other words, a side where a surface of the substrate 70 upon which light is incident), is provided.

The trench-shaped element isolation is provided so as to surround only a pixel having a smaller (narrower) area as described above, so that a signal of a large-area pixel can be prevented from being mixed.

More specifically, a small-area pixel has a sensitivity lower than that of a large-area pixel because a signal amount that a small-area pixel can handle is smaller than a signal amount that a large-area pixel can handle. In a case where a signal of a small-area pixel is mixed into a large-area pixel, a large-area pixel which has a high sensitivity handles the mixed signal as an excess signal. This situation can be prevented by provision of an element isolation surrounding a small-area pixel. Also, regarding a large-area pixel, there is a portion where an element isolation is not provided, so that occurrence of a dark current can be suppressed.

It is noted that the present technology described in the fourth embodiment can be also applied to the first embodiment to the third embodiment.

Also, though the description has been made so far regarding a case of a circuit in which a charge storage unit is provided in a unit pixel, the trench-shaped element isolation according to the present technology can be also applied to a circuit in which a charge storage unit is not provided in a unit pixel. Below, an example of a circuit in which a charge storage unit is not provided in a unit pixel will be described.

6. Fifth Embodiment (Modifications of Trench-Shaped Element Isolation

Next, a fifth embodiment of the present technology will be described.

{Plan View and Cross-Sectional View of Pixel Array Unit 11}

Figure 39:
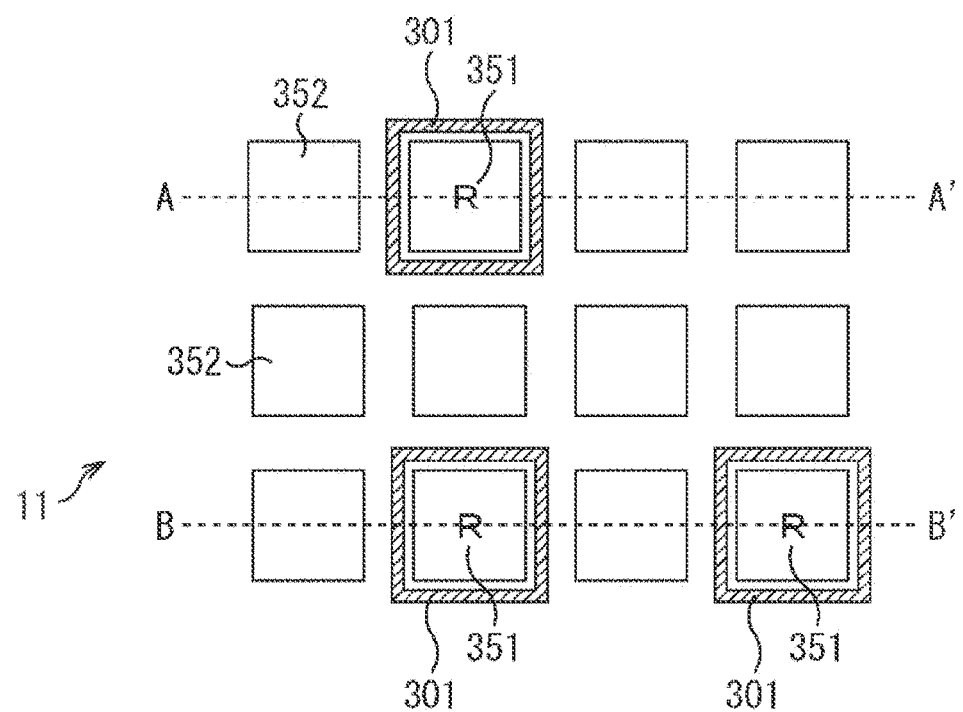
FIG. 39 is a plan view showing a configuration example of a pixel array unit according to a fifth embodiment of the present technology.
Figure 40B:
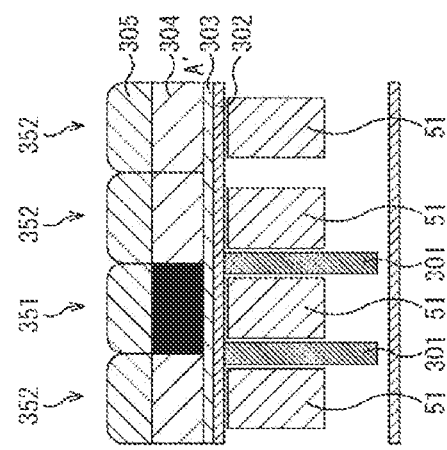
FIGS. 40A and 40B are cross-sectional views showing a configuration example of the pixel array unit in FIG. 39.
Figure 40A:
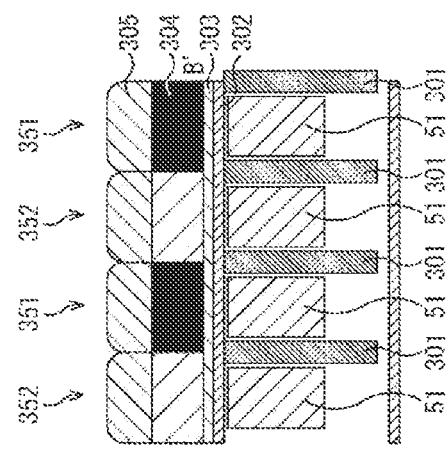

FIG. 39 is a plan view showing a case where a red pixel 351 denoted by a character R and the other pixel 352 are arranged in a pixel array unit 11 and an element isolation 301 is formed only in the red pixel 351. FIGS. 40A and 40B are cross-sectional views showing a configuration example of a unit pixel in FIG. 39. FIG. 40A shows an example of a section taken along a line A-A' in FIG. 39, and FIG. 40B shows an example of a section taken along a line B-B' in FIG. 39.

An antireflection film 302 and a planarizing film 303 are formed on a substrate 70 in which a first photoelectric conversion unit 51 and the element isolation 301 are embedded. On the films 302 and 303, a color filter 304 for each color and an on-chip lens 305 are provided for each photoelectric conversion unit. It is noted that the color filter 304 of the red pixel 351 is solidly shaded in black.

The trench-shaped element isolation is provided so as to surround only a red pixel as described above, so that mixture of a signal into a pixel other than a red pixel can be suppressed.

More specifically, red light may possibly be absorbed by a deep portion of silicon, so that mixture of color of a deep portion inside silicon into an adjacent pixel may occur. Thus, only a red pixel is surrounded, to thereby suppress color mixture. Occurrence of dark current in a pixel other than a red pixel can be prevented because only a red pixel is surrounded.

{Plan View and Cross-Sectional View of Pixel Array Unit 11}

Figure 41:
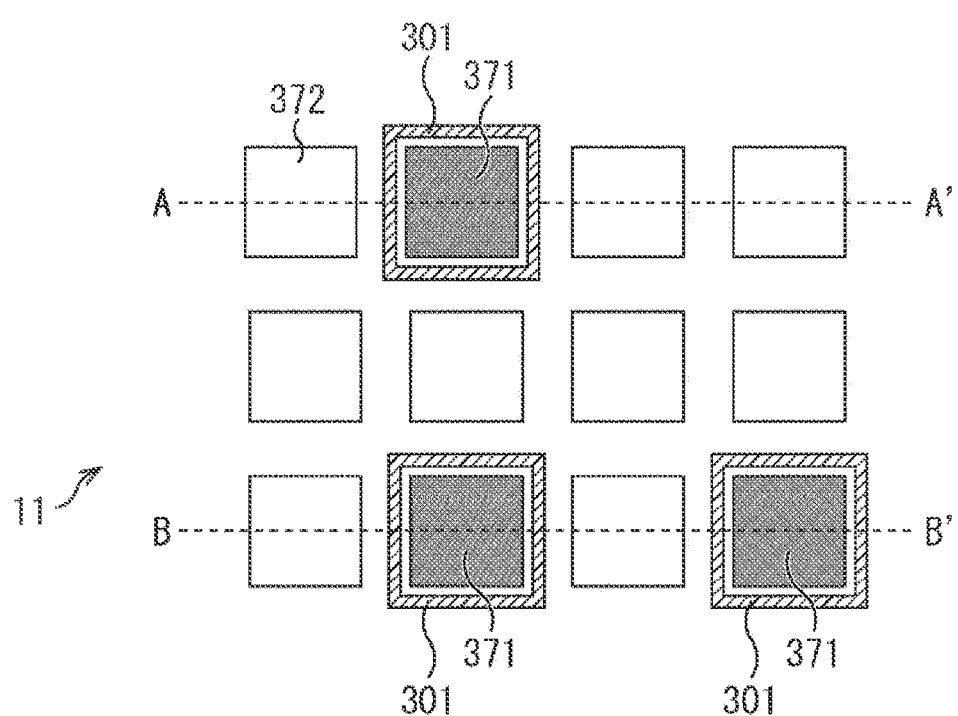
FIG. 41 is a plan view showing another configuration example of the pixel array unit according to the fifth embodiment of the present technology.
Figure 42A:
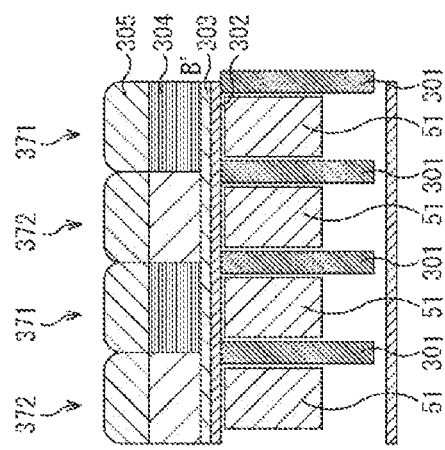
FIGS. 42A and 42B are cross-sectional views showing a configuration example of the pixel array unit in FIG. 41.
Figure 42B:
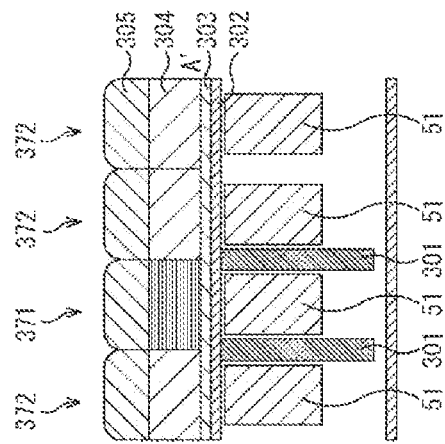

FIG. 41 is a plan view showing a case where a highly-sensitive pixel 371 which has a high sensitivity and is hatched and the other pixel 372 are arranged in a pixel array unit 11 and the element isolation 301 is formed in only the highly-sensitive pixel 371. FIGS. 42A and 42B are cross-sectional views showing an example of the unit pixel in FIG. 41. FIG. 42A shows an example of a section taken along a line A-A' in FIG. 41, and FIG. 42B shows an example of a section taken along a line B-B' in FIG. 41.

The antireflection film 302 and the planarizing film 303 are formed on the substrate 70 in which the first photoelectric conversion unit 51 and the element isolation 301 are embedded. On the films 302 and 303, the color filter 304 for each color and the on-chip lens 305 are provided for each photoelectric conversion unit. It is noted that in the example in FIGS. 41, 42A and 42B, a special filter is used as the color filter 304 of the highly-sensitive pixel 371 and a sensitivity is made different from that of a pixel not using a special filter by a change of transmittance of light, so that a highly-sensitive pixel is provided.

The trench-shaped element isolation is provided so as to surround only a highly-sensitive pixel or a low-sensitive pixel as described above, so that mixture of a signal into a pixel other than a red pixel can be suppressed.

More specifically, in the example of FIG. 41, a special filter is formed below an on-chip lens in a part of pixels. The special filter may be either a filter which increases transmittance or a filter which decreases transmittance. By this filter, pixels having different sensitivities are present. In a case where color of a pixel having a low sensitivity is mixed into a pixel having a high sensitivity, the pixel having a high sensitivity may possibly handle the mixed color as an excess signal. By providing an element isolation which surrounds only a pixel having a high sensitivity, it is possible to suppress occurrence of dark current in a pixel having a low sensitivity while suppressing color mixture. Also, an element isolation may surround only a pixel having a low sensitivity.

{Plan View and Cross-Sectional View of Pixel Array Unit 11}

Figure 43:
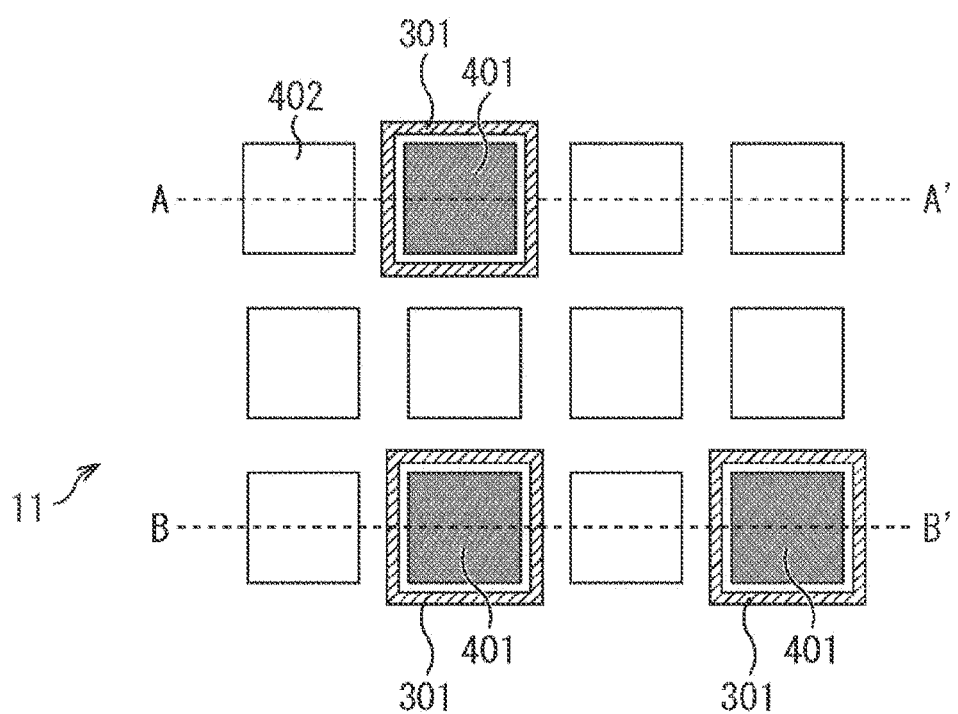
FIG. 43 is a plan view showing another different configuration example of the pixel array unit according to the fifth embodiment of the present technology.
Figures 44A, 44B:
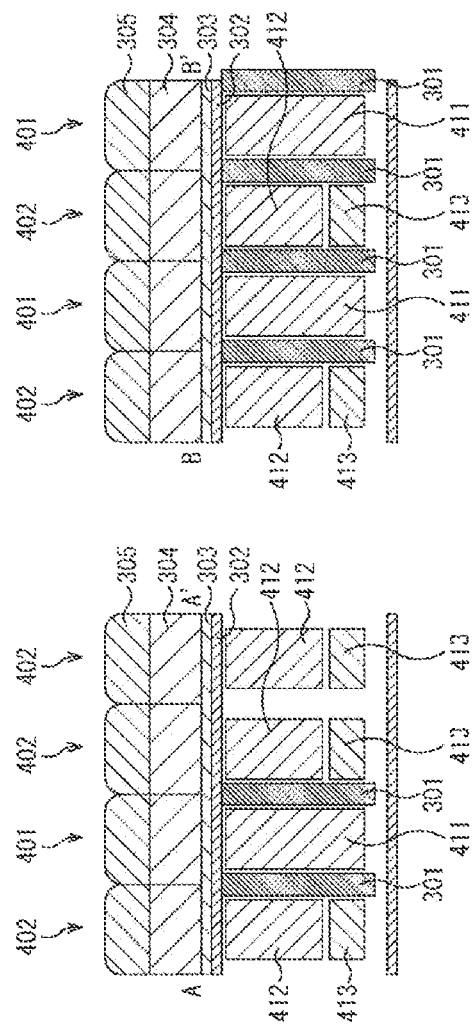
FIGS. 44A and 44B are cross-sectional views showing a configuration example of the pixel array unit in FIG. 43.

FIG. 43 is a plan view showing a case where a highly-sensitive pixel 401 which has a high sensitivity and is hatched and the other pixel 402 are arranged in the pixel array unit 11 and the element isolation 301 is formed in only the highly-sensitive pixel 401. FIGS. 44A and 44B are cross-sectional views showing an example of the unit pixel in FIG. 43. FIG. 44A shows an example of a section taken along a line A-A' in FIG. 43, and FIG. 44B shows an example of a section taken along a line B-B' in FIG. 43.

In the other pixel 402, a P-type semiconductor layer 413 is formed as a photoelectric conversion unit and an N-type semiconductor layer 412 is formed on the layer 413. On the other hand, in the highly-sensitive pixel 401, an N-type semiconductor layer 411 deeper than the other pixel is formed as a photoelectric conversion unit. In the substrate 70, the element isolation 301 is embedded so as to surround the N-type semiconductor layer 411.

The antireflection film 302 and the planarizing film 303 are formed on the substrate 70 in which the element isolation 301 is embedded. On the films 302 and 303, the color filter 304 for each color and the on-chip lens 305 are provided for each photoelectric conversion unit.

The trench-shaped element isolation is provided so as to surround only a highly-sensitive pixel or a low-sensitive pixel as described above, so that mixture of a signal into a pixel other than a red pixel can be suppressed.

More specifically, in the example of FIG. 43, a P-type semiconductor layer is formed in a part of pixels, so that a difference in depth among N-type semiconductor layers serving as light-receiving units is produced. Then, a pixel including a deeper N-type semiconductor layer has a higher sensitivity. In a case where color of a pixel having a low sensitivity is mixed into a pixel having a high sensitivity, the pixel having a high sensitivity may possibly handle the mixed color as an excess signal. By providing an element isolation which surrounds a pixel having a low sensitivity, it is possible to suppress the foregoing situation. Also, by providing an element isolation which surrounds only a pixel having a high sensitivity, it is possible to suppress occurrence of dark current in a pixel having a low sensitivity while suppressing color mixture. Also, an element isolation may surround only a pixel having a low sensitivity.

{Cross-Sectional View of Pixel Array Unit 11}

Figure 45:
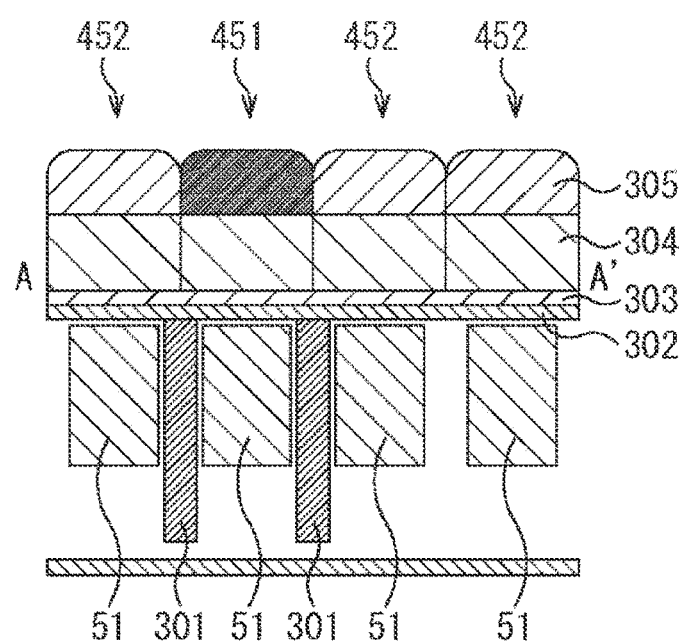
FIG. 45 is a plan view showing a still further different configuration example of the pixel array unit according to the fifth embodiment of the present technology.

FIG. 45 is a cross-sectional view showing an example of the pixel array unit 11. An insulating film may be used for the trench-shaped element isolation 301 which surrounds the first photoelectric conversion unit 51 of a specific pixel 451. Also, an insulating film including a negative fixed-charge film may be used for the element isolation 301. As an insulating film used for the element isolation 301, Hf02, Al203, Ta205, or the like is employed, for example. Further, a P-type silicon layer may be provided around an element isolation. By the above-described designs, occurrence of dark current can be suppressed.

Also, a light-shielding film may be used for the trench-shaped element isolation 301. This can enhance light-shielding performance, and suppress color mixture.

As described above, according to the present technology, a trench-shaped element isolation structure is formed so as to surround only a specific pixel in a backside-illuminated image sensor including a plurality of pixels which are two-dimensionally arranged.

It is noted that though the above description has dealt with an example of a backside solid-state imaging device, the present technology can be applied to a frontside solid-state imaging device also.

It is noted that a solid-state imaging device may be of a type which is formed as one chip, or alternatively be in a form of a module with an imaging function which includes an imaging unit, a signal processor, and an optical system which are packaged together.

7. Examples of Use of Image Sensor

Figure 46:
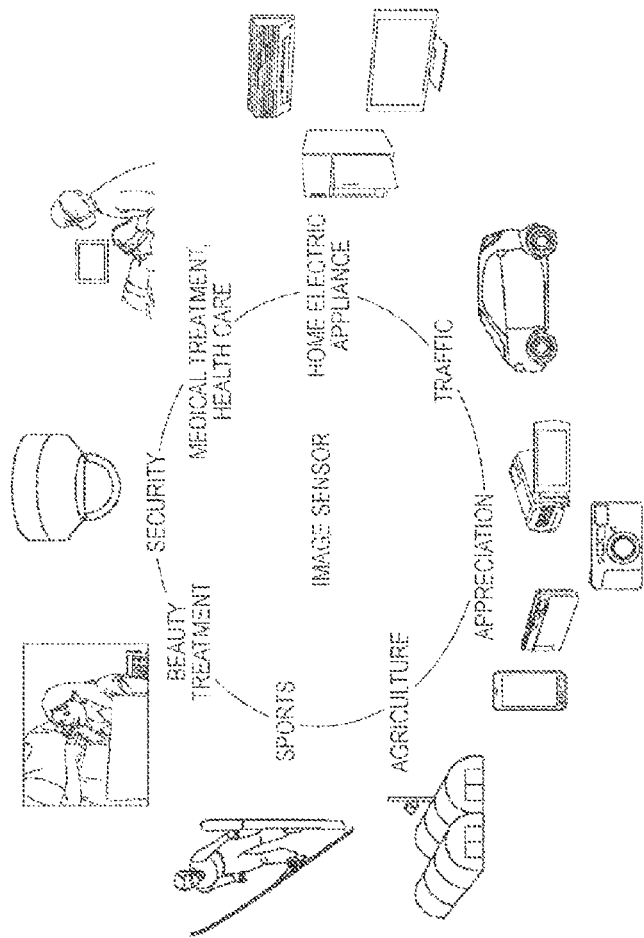
FIG. 46 is a view showing examples of use of an image sensor to which the present technology is applied.

FIG. 46 is a view showing examples of use of the above-described solid-state imaging device.

The above-described solid-state imaging device (image sensor) can be used in various cases where sensing of light such as visible light, infrared light, ultraviolet light, or an X ray is performed, as follows, for example.

- An apparatus which takes a photograph of an image which is to be offered for appreciation, including a digital camera, a portable apparatus having a camera function, and the like.
- An apparatus which is put to a use of traffic, including: an on-vehicle sensor which takes a photograph of the front, the rear, surroundings, an inside, and the like of a vehicle for safe driving such as automatic stop, for recognition of a driver's state, or for the other purposes; a monitoring camera which monitors a traveling vehicle or a road; a range sensor which measures a distance such as a distance between vehicles; and the like.
- An apparatus which is provided in a home electric appliance such as a television, a refrigerator, or an air conditioner, in order to take a photograph of a gesture of a user, and perform a machine operation in accordance with the gesture.
- An apparatus which is put to a use of medical treatment or health care, including an endoscope, an apparatus which performs angiography with reception of infrared light, and the like.
- An apparatus which is put to a use of security, including a monitoring camera for a security purpose, a camera used for person identification, and the like.
- An apparatus which is put to a use of beauty treatment, including a skin-state measuring apparatus which takes a photograph of a skin, a microscope which takes a photograph of a scalp, and the like.
- An apparatus which is put to a use of sports, including an action camera, a wearable camera, and the like which are used in doing sports or the like.
- An apparatus which is put to an agricultural use, including a camera for monitoring states of a field and a crop, and the like.

8. Configuration Example of Electronic Apparatus

Further, the present technology is not limited to application to a solid-state imaging device, and can be applied to an imaging apparatus. In this regard, an imaging apparatus means a camera system such as a digital still camera or digital video camera, and an electronic apparatus having an imaging function such as a portable telephone. It is noted that a module form mounted onto an electronic apparatus, that is, a camera module, is regarded as an imaging apparatus in some cases.

{Imaging Apparatus}

Figure 47:
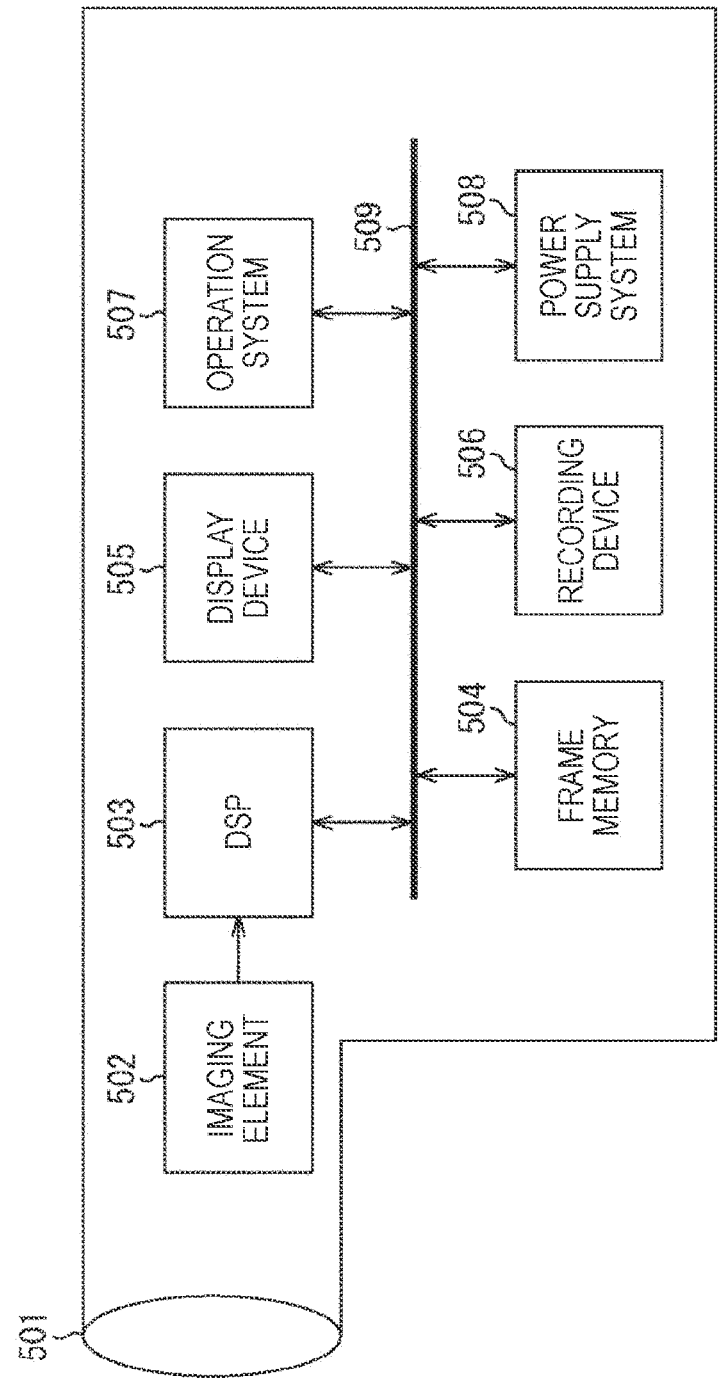
FIG. 47 is a block diagram showing a configuration example of an electronic apparatus to which the present technology is applied.

FIG. 47 is a block diagram showing a configuration example of an imaging apparatus (camera apparatus) 501 which is one example of an electronic apparatus to which the present technology is applied.

As shown in FIG. 47, the imaging apparatus 501 includes an optical system including a lens group 511 or the like, an imaging element 512, a DSP circuit 513 serving as a camera signal processing unit, a frame memory 514, a display device 515, a recording device 516, an operation system 507, a power supply system 518, and the like. Then, it is configured such that the DSP circuit 513, the frame memory 514, the display device 515, the recording device 516, the operation system 507, and the power supply system 518 are connected to each other via a bus line 519.

The lens group 511 captures incident light (image light) provided from a subject, and forms an image on an imaging surface of the imaging element 512. The imaging element 512 converts an amount of incident light from which an image is formed on an imaging surface by the lens group 511, to an electric signal on a pixel-by-pixel basis, and outputs a pixel signal.

The display device 515 includes a panel display device such as a liquid crystal display device or an organic electro luminescence (EL) display device, and displays a moving image or a still image captured by the imaging element 512. The recording device 516 records a moving image or a still image captured by the imaging element 512 on a recording medium such as a memory card, a video tape, or a digital versatile disk (DVD).

The operation system 507 issues operation commands for various functions of the imaging apparatus 501, in accordance with a user's operation. The power supply system 518 provides various power supplies which serve as operation power supplies of the DSP circuit 513, the frame memory 514, the display device 515, the recording device 516, and the operation system 507, to the foregoing elements being supplied, as appropriate.

The above-described imaging apparatus 501 is applied to a video camera and a digital still camera, and further, a smartphone and a camera module for a mobile apparatus such as a portable telephone. Then, the solid-state imaging device according to each of the above-described embodiments can be used as the imaging element 512 in the imaging apparatus 501. As a result of this, image quality of the imaging apparatus 501 can be improved.

It is noted that embodiments of the present technology are not limited to the above-described embodiments, and various modifications are possible within a scope not departing from essence of the present technology.

It is noted that a series of steps elaborating a process described in the present specification includes not only a process which is chronologically performed in the described order, but also a process which is not necessarily chronologically performed, but performed parallely or individually.

Also, embodiments in the present disclosure are not limited to the above-described embodiments, and various modifications are possible within a scope not departing from essence of the present disclosure.

Also, a configuration which has been described above as one device (or processing unit) may be divided and configured as a plurality of devices (or processing units). Conversely, a configuration which has been described above as a plurality of devices (or processing units) may be collected and configured as one device (or processing unit). Also, a configuration other than those described above may be added to each device (or each processing unit), of course. Further, a part of a configuration of a certain device (or processing unit) may be included in a configuration of another device (or another processing unit) so far as a configuration and operations of a system as a whole are substantially unchanged. That is, the present technology is not limited to the above-described embodiments, and modifications are possible within a scope not departing from essence of the present technology.

While preferred embodiments of the present disclosure have been described in detail with reference to the accompanying drawings hereinabove, the disclosure is not limited to the described examples. It is obvious that a person having ordinary skill in the technical field that the present disclosure belongs to, could think of various modifications and revisions within a scope of a technical idea described in claims, and it is understood that also those modifications and revisions are included in a technical scope of the present disclosure, of course.

It is noted that the present technology can take the following configurations.

(1) A solid-state imaging device including:
a pixel array unit in which a plurality of unit pixels are arranged; and
a drive unit configured to control an operation of the unit pixels, in which
each of the unit pixels includes:
a photoelectric conversion unit; and
a trench-type charge storage unit configured to store charge generated by the photoelectric conversion unit.

(2) The solid-state imaging device according to (1), in which
the charge storage unit is placed between the photoelectric conversion unit and another photoelectric conversion unit included in an adjacent one of the unit pixels.

(3) The solid-state imaging device according to (1), in which
each of the unit pixels includes a plurality of the photoelectric conversion units, and
the charge storage unit is placed between the plurality of photoelectric conversion units, or between the photoelectric conversion unit and another photoelectric conversion unit included in an adjacent one of the unit pixels.

(4) The solid-state imaging device according to any of (1) to (3), in which
each of the unit pixels further includes a reverse-side DTI (RDTI) placed adjacently to the charge storage unit.

(5) The solid-state imaging device according to (4), in which
the RDTI is formed so as to be joined to the charge storage unit.

(6) The solid-state imaging device according to any of (1) to (5), in which
the charge storage unit is formed so as to penetrate a substrate.

(7) The solid-state imaging device according to any of (1) to (6), in which
a potential of one end of the charge storage unit is a ground potential, a power-supply potential, or a third potential.

(8) The solid-state imaging device according to (7), in which
the potential of the one end of the charge storage unit is set at different potentials at a storing time and a reading time of the photoelectric conversion unit.

(9) The solid-state imaging device according to any of (1) to (8), in which
the solid-state imaging device is of a backside-illuminated type.

(10) An electronic apparatus including:
a solid-state imaging device including:
a pixel array unit in which a plurality of unit pixels are arranged; and
a drive unit configured to control an operation of the unit pixels,
each of the unit pixels including:
a photoelectric conversion unit; and
a trench-type charge storage unit configured to store charge generated by the photoelectric conversion unit;
a signal processing circuit configured to process an output signal output from the solid-state imaging device; and
an optical system configured to provide incident light to the solid-state imaging device.

(11) A solid-state imaging device including:
a pixel array unit in which a plurality of unit pixels are arranged; and
a drive unit configured to control an operation of the unit pixels, in which
each of the unit pixels includes:
a first photoelectric conversion unit;
a second photoelectric conversion unit having a sensitivity lower than that of the first photoelectric conversion unit;
a charge storage unit configured to store charge generated by the second photoelectric conversion unit, the charge storage unit including a gate electrode of metal and a High-k insulating film; and
a transistor configured to transfer charge generated by the first or second photoelectric conversion unit.

(12) The solid-state imaging device according to (11), in which
the charge storage unit is placed simultaneously with the transistor.

(13) The solid-state imaging device according to (11) or (12), in which
the metal is a metal having a high melting point of Ti, TiN, or W, or a compound of the metal.

(14) The solid-state imaging device according to any of (11) to (13), in which
the High-k insulating film is Hf02, Al203, or Ta205.

(15) The solid-state imaging device according to any of (11) to (14), in which
the solid-state imaging device is of a backside-illuminated type.

(16) An electronic apparatus including:
a solid-state imaging device including:
  a pixel array unit in which a plurality of unit pixels are arranged; and
  a drive unit configured to control an operation of the unit pixels,
  each of the unit pixels including:
    a first photoelectric conversion unit;
    a second photoelectric conversion unit having a sensitivity lower than that of the first photoelectric conversion unit;
    a charge storage unit configured to store charge generated by the second photoelectric conversion unit, the charge storage unit including a gate electrode of metal and a High-k insulating film; and
    a transistor configured to transfer charge generated by the first or second photoelectric conversion unit,
the electronic apparatus further including:
a signal processing circuit configured to process an output signal output from the solid-state imaging device; and
an optical system configured to provide incident light to the solid-state imaging device.

(17) A solid-state imaging device including:
a pixel array unit in which a plurality of unit pixels are arranged;
a drive unit configured to control an operation of the unit pixels; and
a trench-shaped element isolation.

(18) The solid-state imaging device according to (17), in which
the element isolation is formed so as to surround a specific one of the unit pixels.

(19) The solid-state imaging device according to (17) or (18), in which
each of the unit pixels includes:
a first photoelectric conversion unit; and
a second photoelectric conversion unit having a sensitivity lower than that of the first photoelectric conversion unit, and
the element isolation is formed so as to surround the second photoelectric conversion unit.

(20) The solid-state imaging device according to any of (17) to (19), in which
the element isolation includes Hf02, Al203, or Ta205.

(21) An electronic apparatus including:
a solid-state imaging device including:
  a pixel array unit in which a plurality of unit pixels are arranged;
  a drive unit configured to control an operation of the unit pixels; and
  a trench-shaped element isolation;
a signal processing circuit configured to process an output signal output from the solid-state imaging device; and
an optical system configured to provide incident light to the solid-state imaging device.

(22) A solid-state imaging device including:
a pixel array unit in which a plurality of unit pixels are arranged; and
a drive unit configured to control an operation of the unit pixels, in which
each of the unit pixels includes:
  a first photoelectric conversion unit;
  a second photoelectric conversion unit having a sensitivity lower than that of the first photoelectric conversion unit;
  a trench-shaped element isolation formed so as to surround the second photoelectric conversion unit;
  a charge storage unit configured to store charge generated by the second photoelectric conversion unit;
  a charge-to-voltage conversion unit;
  a first transfer gate unit configured to transfer charge from the first photoelectric conversion unit to the charge-to-voltage conversion unit;
  a second transfer gate unit configured to join potentials of the charge-to-voltage conversion unit and the charge storage unit;
  a third transfer gate unit configured to transfer charge from the second photoelectric conversion unit to the charge storage unit; and
  an overflow path formed in a lower portion of a gate electrode of the third transfer gate unit, the overflow path being configured to transfer charge overflowing from the second photoelectric conversion unit, to the charge storage unit.

(23) The solid-state imaging device recited in the above (22), in which the element isolation is deeper than the first photoelectric conversion unit and the second photoelectric conversion unit.

REFERENCE SIGNS LIST

10 CMOS image sensor
11 Pixel array unit
12 Vertical drive unit
14 Horizontal drive unit
15 System control unit
50 Unit pixel
51 First photoelectric conversion unit
52 First transfer gate unit
54 Second transfer gate unit
56, 56-1, 56-2 Charge storage unit
57 Reset gate unit
58 FD unit
59 Amplification transistor
60 Selection transistor
70 Substrate
71, 71a to 71c Upper electrode
72, 72a to 72c Insulating film
73, 73a to 73c Diffusion layer
81-1 to 81-4 Wire
90 DTI
91 RDTI
92 Insulating layer
100 Pixel isolating region
102 Trench
150 Unit pixel
151 Third transfer gate
152 Fourth transfer gate
153 Second photoelectric conversion unit
154 Constant-current supply
211 Metal gate electrode
212 High-k insulating film
213 Lower electrode
214 Poly electrode
215 Interlayer film 221 High-k insulating film
300 Unit pixel
301 Element isolation
302 Antireflection film
303 Planarizing film
304 Color filter
305 On-chip lens
351 Red pixel
352 The other pixel
371 Highly-sensitive pixel
372 The other pixel
401 Highly-sensitive pixel
402 The other pixel
411 N-type semiconductor layer
412 N-type semiconductor layer
413 P-type semiconductor layer

The invention claimed is:

1. A light detecting device, comprising:
   a pixel array that includes a pixel unit; and
   a plurality of vertical signal lines that includes a signal line coupled to the pixel unit of the pixel array, wherein the pixel unit includes:
   a first photoelectric conversion region;
   a second photoelectric conversion region, wherein a light receiving surface of the first photoelectric conversion region is larger than a light receiving surface of the second photoelectric conversion region;
   a first transfer transistor coupled to the first photoelectric conversion region;
   a floating diffusion region configured to store charge transferred via the first transfer transistor;
   a second transfer transistor coupled to the floating diffusion region;
   a charge storing region that includes a metal electrode and an insulating film, wherein the charge storing region is configured to surround a plurality of sides of the second photoelectric conversion region;
   a third transfer transistor coupled to the charge storing region;
   a selection transistor; and
   an amplification transistor configured to output a pixel signal to the signal line via the selection transistor, wherein
      the pixel signal is outputted based on the stored charge, and
      a shape of the insulating film is a concave shape in a cross-sectional view of the pixel unit.

2. The light detecting device according to claim 1, wherein the metal electrode includes one of Ti, TiN, or W.

3. The light detecting device according to claim 1, wherein the insulating film covers a bottom of the metal electrode and a part of a plurality of sides of the metal electrode.

4. The light detecting device according to claim 1, further comprising a reset transistor coupled to the second transfer transistor.

5. The light detecting device according to claim 1, further comprising a wiring layer that includes the charge storing region.

6. The light detecting device according to claim 1, wherein the selection transistor is between a source electrode of the amplification transistor and the signal line.

7. The light detecting device according to claim 1, further comprising
   a fourth transfer transistor between the second photoelectric conversion region and the charge storing region.

8. The light detecting device according to claim 7, wherein the charge storing region includes a capacitor that is between the third transfer transistor and the fourth transfer transistor.

9. The light detecting device according to claim 1, wherein the second transfer transistor is between the charge storing region and the floating diffusion region.

* * * * *